US008781779B2

(12) United States Patent  
Casler, Jr. et al.

(10) Patent No.: US 8,781,779 B2
(45) Date of Patent: Jul. 15, 2014

(54) METHODS AND APPARATUSES FOR DYNAMIC PROBE ADJUSTMENT

(71) Applicant: Formfactor, Inc., Livermore, CA (US)

(72) Inventors: Richard James Casler, Jr., Lowell, MA (US); Fenglei Du, Fremont, CA (US); Stephen Craig Fullerton, Jacksonville Beach, FL (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 13/673,111

(22) Filed: Nov. 9, 2012

(65) Prior Publication Data

US 2013/0103338 A1  Apr. 25, 2013

Related U.S. Application Data

(63) Continuation of application No. 11/335,056, filed on Jan. 18, 2006, now Pat. No. 8,311,758.

(51) Int. Cl.
*G01C 3/00* (2006.01)

(52) U.S. Cl.
USPC .......... 702/94; 702/150; 324/757.01

(58) Field of Classification Search
USPC .............. 702/85, 87, 88, 94, 95, 97; 324/758, 324/758.01–758.05
See application file for complete search history.

(56) References Cited

U.S. PATENT DOCUMENTS

| 6,111,421 | A | 8/2000 | Takahashi et al. |
| 6,621,262 | B2 | 9/2003 | Strom |
| 2003/0025495 | A1 | 2/2003 | Ilno et al. |
| 2003/0094914 | A1 | 5/2003 | Yanagita et al. |
| 2004/0036861 | A1* | 2/2004 | Yoshioka ............ 356/237.1 |
| 2004/0227535 | A1 | 11/2004 | Kobayashi et al. |

FOREIGN PATENT DOCUMENTS

| EP | 1 258 733 A | 11/2002 |
| EP | 1 519 200 A1 | 3/2005 |

OTHER PUBLICATIONS

PCT Notification of Transmittal of the International Search Report and the Written Opinion of the International Searching Authority; PCT International Search Report; and PCT Written Opinion of the International Searching Authority, International Application No. PCT/US2006/041993, mailed Apr. 5, 2007, total 12 pages.
PCT Notification Concerning Transmittal of International Preliminary Report on Patentability (Chapter I of the Patent Cooperation Treaty) Application No. PCT/US2006/041993, mailed Jul. 31, 2008, total 10 pages.

\* cited by examiner

*Primary Examiner* — Manuel L Barbee
(74) *Attorney, Agent, or Firm* — Blakely, Sokoloff, Taylor & Zafman LLP

(57) ABSTRACT

An improved method and apparatus for automatically aligning probe pins to the test or bond pads of semiconductor devices under changing conditions. In at least one embodiment, a dynamic model is used to predict an impact of changing conditions to wafer probing process. This reduces the need for frequent measurements and calibrations during probing and testing, thereby increasing the number of dice that can be probed and tested in a given period of time and increasing the accuracy of probing at the same time. Embodiments of the present invention also make it possible to adjust positions of probe pins and pads in response to the changing conditions while they are in contact with each other.

30 Claims, 21 Drawing Sheets

242

| Element | Thermal Conductivity (W/m-K) | Thermal Expansion Coefficient (1/K) | Specific Heat (J/Kg-K) |
|---|---|---|---|
| Silicon (Si) | 148 | $3 \times 10^{-6}$ | 700 |
| Silicon Nitride ($Si_3N_4$) | 30 | $3.3 \times 10^{-6}$ | 690 |
| Silicon Dioxide ($SiO_2$) | 1.4 | $0.5 \times 10^{-6}$ | 745 |
| Aluminum (Al) | 237 | $23 \times 10^{-6}$ | 900 |
| Copper (Cu) | 401 | $17 \times 10^{-6}$ | 380 |
| Invar | 13.8 | $1.2 \times 10^{-6}$ | 480 |
| Super Invar | - | $0.6 \times 10^{-6}$ | - |

FIG. 4

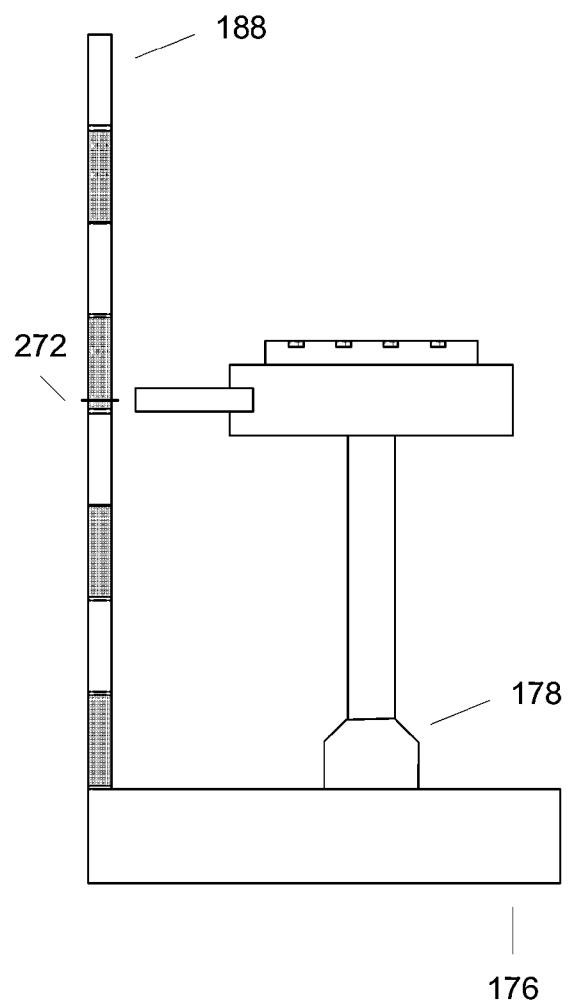
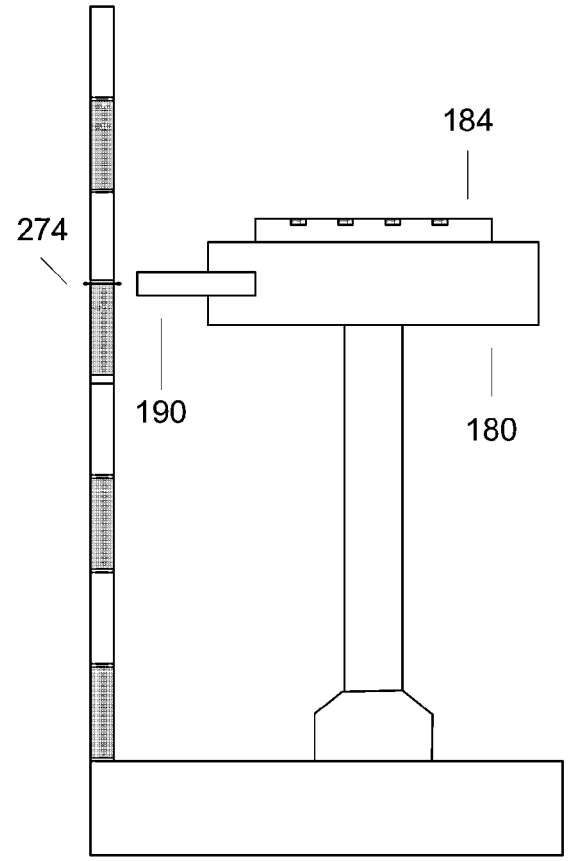
FIG. 5A
FIG. 5B

METHODS AND APPARATUSES FOR DYNAMIC PROBE ADJUSTMENT

This application is a continuation of co-pending U.S. patent application Ser. No. 11/335,056, filed on Jan. 18, 2006 entitled "METHODS AND APPARATUSES FOR DYNAMIC PROBE ADJUSTMENT".

BACKGROUND OF THE INVENTION

1. Field of the Invention

The present invention relates generally to semiconductor manufacturing process. More particularly, the present invention relates to probing and testing of dice.

2. Description of the Related Art

Electronics based on semiconductor technologies has become an essential and integral part of modern life over the last few decades. Semiconductor chips containing millions of components are embedded in many electronic devices or machineries, and these semiconductor-based electronic devices are commonly found in many areas of our life, including entertainment, medicine, manufacturing, and transportation.

As these electronic devices become more ubiquitous, the requirements placed on semiconductor chips are getting stricter and broader. Many integrated circuit (IC) chips are, for example, used in modern vehicles (e.g. a passenger car) for various purposes and functions, some of which are crucial for operation of the vehicles. Many of these chips, produced in the same way or from the same process, should be operable in many different and sometimes varying environments such as temperature variations ranging from −50° Celsius to 200° Celsius or sometimes much higher. This requirement on electronic devices, in turn, puts additional requirements on semiconductor manufacturing processes. Among other things, IC chips need to be tested in these different operating environments. For example, it is not uncommon for manufacturers to test these chips at many different temperatures during the manufacturing process, often before packaging.

IC chips are often manufactured on a semiconductor substrate such as a silicon wafer. A semiconductor wafer, typically of a circular shape, usually includes numerous IC devices arranged in a grid pattern. Located on each IC are multiple test or bond pads that are used to connect the IC to external circuitry to allow the IC to function. These IC chips on a wafer, or dice, are often tested using a probe card connected to a testing machine. The probe card has a collection of contact electrodes, or probe pins. The wafer is then positioned, in preparation for testing, so that the pins on the probe card make contact with the die's test or bond pads. This process is known as wafer probing, and a special machine called a wafer prober is used for this purpose. Electroglas, Inc. of San Jose, Calif. is a company which makes wafer probers. In some cases, probing is done on a die or dice which have been cut, or diced, and mounted on other flexible or rigid substrates such as film-frames or "strips". Electroglas, Inc., for example, also manufactures machines designed for this purpose, often called test handlers. However, many relevant operations of probing and testing in these cases are essentially the same as in the case of probing or testing of (unpackaged) dice on uncut wafers. We will use the term wafer probing, or die probing, to include these more general situations throughout this disclosure.

The primary purpose of wafer probing is to properly position the wafer so that the device's test or bond pads, or simply pads, make sufficient electrical contact with a probe card's probe tips. High accuracy is required because the pads are very small, often of the order of 30–50 microns. If a probe card pin makes contact outside the pad area the device must be repositioned, slowing down the testing process, and often requiring operator intervention. Moreover, incorrect positioning can cause damage to the device since the probe card pins may break through the passivation layer of the device.

Changing testing conditions or environments in the middle of a wafer probing and testing procedure for a particular wafer or from wafer to wafer is a rather expensive requirement. Once the testing condition is changed, the wafer probing, as well as measurement and calibration, should be redone since probe cards and wafers and other components involved in probing and testing might have different properties and characteristics under different physical conditions. What is more critical is the fact that it takes a while for the system to reach a steady state after change in condition, such as change in the temperature of a wafer chuck. For example, it takes over an hour for a typical wafer prober system to reach a thermal equilibrium after a temperature change of 100° C. or so. This is often referred to as thermal agility of the wafer prober in the related art. If no testing can be done during this period of thermal relaxation, the number of dice that can be tested in a given amount of time will be significantly reduced, thereby adding additional overhead to the production cost per integrated circuit device.

Different materials in the system typically have different susceptibilities and they react differently to changing conditions, further complicating the testing process during the transient period, in which states of the various components within the wafer prober system are changing. For example, when a controlled temperature of a wafer chuck is changed, different parts of a probe card, a wafer, cameras, etc, all expand or contract at different rates and with different amounts.

Present known methods of wafer probing often exhibit inferior performance, especially under dynamically changing conditions such as large changes in temperature. In the current state of the art where probing and testing is done under varying conditions (e.g. at different temperatures), new measurement and calibration is typically done after an environmental change has equilibrated and is performed frequently thereafter until the misalignment shifts are verified to be small. Considering the fact that a measurement and calibration typically takes an order of a minute, frequent measurements can significantly reduce the number of dice that can otherwise be tested in a given time period.

A typical probing and testing process, after change in temperature, in the prior art is shown in FIG. 1A. The flow chart starts at block 102 and ends at 114. Once the temperature of a wafer chuck is changed and a sufficient amount of time has passed 104, a new measurement and calibration needs to be done 106 before probing any further dice. Then, a die or a set of dice is selected and probed based on the previous measurement 108. Once probing is done, desired testing is performed on the selected die or set of dice 110. Then, the process either terminates or continues with another die or set of dice depending on requirements and other conditions 112. In the case where the process continues, the wafer prober needs to be re-calibrated 106 to account for the changing dimensions due to thermal expansion or contraction of various materials. This is because the temperatures of various parts of the prober, including a probe card and a wafer, are constantly changing during the transient period, asymptotically reaching a new temperature that relates to the change in the controlled temperature of the wafer chuck. In this particular scenario shown in the flow chart, if probing and testing of a particular die or dice takes longer than a certain critical duration of time, the testing cannot be done efficiently during the transient period.

When multiple probing and testing are done between each calibration, the parameters from the most recent measurement are used for all subsequent probing before the next measurement. Since a system tends to relax in a roughly exponential fashion and because the thermally-induced misalignment error dynamics is similar to that of a "random walk", these values will get less and less accurate on average as the time between two consecutive measurements increases. This will further reduce the number dice that can be probed and tested within a given time period. Furthermore, less and less accurate values will be used at or near the end of each measurement and calibration cycle, and it will increase potential for testing errors and further risk damaging the devices being tested.

FIG. 1B shows an example of this process, in the prior art, for probing and testing dice after a change in temperature. This exemplary process can be implemented, for example, using a commercially available wafer prober Horizon 4090® by Electroglas, Inc. The process, defined between terminal blocks 122 and 134, starts from block 124, where the control temperature of a wafer chuck changes from $T_1$ to $T_2$. Once the wafer chuck reaches the desired temperature $T_2$, dimensions of various components of the wafer prober machine, and distances between these components, need to be measured and various measuring gauges and tools need to be calibrated, as shown in block 126. Then the probing 128 is done based on the measured values, and the testing process 130 follows. After the testing is done, the process can either terminate, following the Yes branch at block 132, or it can continue with other dice, following the No branch.

During the transient period (e.g. as the temperatures of various components approach their respective equilibrium or steady-state temperatures), the prober needs to be re-aligned frequently (e.g. once every minute) to account for the changing dimensions due to thermal expansion or contraction of various components. In the flow chart shown in FIG. 1B, the decision as to whether a new measurement is needed is made based on the time elapsed since the last measurement and/or based on the temperature change of a particular component since the last measurement. This is illustrated in blocks 138 and 140 in the figure. At block 138, the elapsed time and/or the temperature changes of relevant parts of the wafer prober are measured. Then, at block 140, these values are compared to preset values. If the elapsed time is longer than a preset duration, or if any of the temperature changes of the relevant components since the last measurement is larger than a certain preset value, then a new measurement is required, and the process continues through the Yes branch at 140. On the other hand, if these criteria are not met, the probing and testing continues, following the No branch at 140, without new offset measurements.

It should be noted that the flow chart of FIG. 1B shows two loops, one going through 132, 138, 140, 128, and 130, which we call the inner loop, and the other going through 132, 138, 140, 126, 128, and 130, which we call the outer loop. Depending on the outcome of the decision block 140, the process can flow through either loop. During the process of testing and probing multiple dice or sets of dice, the more often the inner loop is used, the more dice can be probed and tested. However, the measurement values used for any particular probing will be less and less accurate. On the other hand, the more often the outer loop is traversed, the more accurate the probing will be. However, less number of dice can be probed and tested at the expense of the higher accuracy. Moreover, there is inherent limitation to the accuracy that can be attained in the prior art.

BRIEF SUMMARY OF THE DESCRIPTION

The present invention provides improved methods and apparatuses for probing dice. In particular, the present invention provides novel methods and apparatuses for automatically aligning a plurality of contact electrodes with a plurality of test or bond pads of an integrated circuit device under changing conditions.

According to at least one embodiment of the present invention, an improved method and apparatus for wafer probing under dynamically changing conditions is provided. In particular, an accurate method for estimating relevant parameters for probing without frequent measurements and calibrations is provided. In one aspect of embodiments of the present invention, probing can be done during the transient period. In another aspect of certain embodiments, probing can be done while the testing is being performed.

In at least one embodiment of the present invention, a dynamic model is used to accurately predict an impact of changing conditions to wafer probing process within a predetermined error tolerance. For example, distances between certain key components of a wafer prober might be changing while various parts of the system are adjusting to a change in the temperature of a wafer chuck. Using a mathematical model to predict the relevant alignment shift as a function of time reduces the need for frequent measurements and calibrations before and/or during probing, thereby increasing the number of dice that can be probed and tested in a given time period. It increases the accuracy of probing at the same time, especially when multiple dice are probed and tested between two consecutive measurements and calibrations. In some embodiments, a linear filter such as Kalman filter is used in predicting temporal dynamics of the alignment shift. Kalman filter, for example, is often used in modeling temporal dynamics in a noisy environment, and it has been widely, and often successfully, used in various fields including computer vision and autonomous navigation. The Kalman filter is proved to be optimal in a statistical sense under certain well-defined conditions/assumptions, and it delivers high-quality estimates and predictions of the state of a stochastic dynamical systems-linear systems, like those of the wafer prober thermal environment, that are driven by fluctuating input and measurement noise sources.

At least one embodiment of the present invention utilizing a mathematical model features the following operations: (1) Relevant components and their geometries that can be used for probing are first identified, (2) a dynamic model is built for these relevant components based on various assumptions and measurement data for a particular prober or a class of probers, and (3) this model is then used in subsequent probing and testing. The present invention reduces the need for frequent measurement and calibration, which typically takes an order of a minute, and hence it substantially increases the number of dice that can be tested in a given time period.

According to at least one embodiment, probing can be done, either continuously or intermittently, while testing is being performed. This increases the number of dice that can be probed and tested within a given amount of time while the prober system is still adjusting in response to the new condition. Furthermore, this also increases the overall accuracy of probing by filtering the measurement noise, which is often infeasible in the prior art.

These and other embodiments, features, aspects, and advantages of the present invention will be apparent from the accompanying drawings and from the detailed description and appended claims which follow.

BRIEF DESCRIPTION OF THE DRAWINGS

The present invention is illustrated by way of example and not limitation in the figures of the accompanying drawings, in which like references indicate similar elements and in which:

FIG. 4 shows various thermal characteristics of relevant materials which are part of wafer prober system.

FIGS. 5A and 5B illustrate change in size of a wafer prober, in particular change in the height of a wafer chuck.

DETAILED DESCRIPTION

The present invention will now be described more fully hereinafter with reference to the accompanying drawings, in which various exemplary embodiments of the invention are shown. In the description, for purposes of explanation, numerous specific details are set forth in order to provide a thorough understanding of the present invention. It will be evident, however, to one skilled in the art that this invention may be embodied in many different forms, and it may be practiced without these specific details, and it should not be construed as limited to the embodiments set forth herein; rather, these embodiments are provided so that this disclosure will be thorough and complete, and will fully convey the scope of the invention to those skilled in the art. When appropriate, well-known structures and devices are shown in block diagram form in order to avoid unnecessarily obscuring the present invention.

Furthermore, the fact that the temperature is often used as an example of an external stimulus or condition in the following description should not be construed as limitations of the present invention. People of ordinary skill in the art will appreciate that embodiments of the present invention can be practiced under many different conditions, including but not limited to change in temperatures.

A system and method is hereby described for automatic wafer probing. Various embodiments of the present invention may be implemented in discrete hardware components or, alternatively, in programmed processing units such as digital signal processors using software which is compiled, linked and then loaded from disk-based storage for execution during run-time. Various programs containing the methods employed in these embodiments may also reside in firmware or other similar non-volatile storage devices.

According to at least one embodiment of the present invention, an improved method and apparatus for wafer probing under changing conditions is provided. In particular, an accurate method for estimating relevant parameters for probing without frequent measurements and calibrations is provided. In one aspect of the invention, probing can be done during the transient period, in which temperatures within the prober system are changing, and while the testing is being performed. Various embodiments of the present invention will now be described in detail with reference to the accompanied drawings.

Figure 1A:
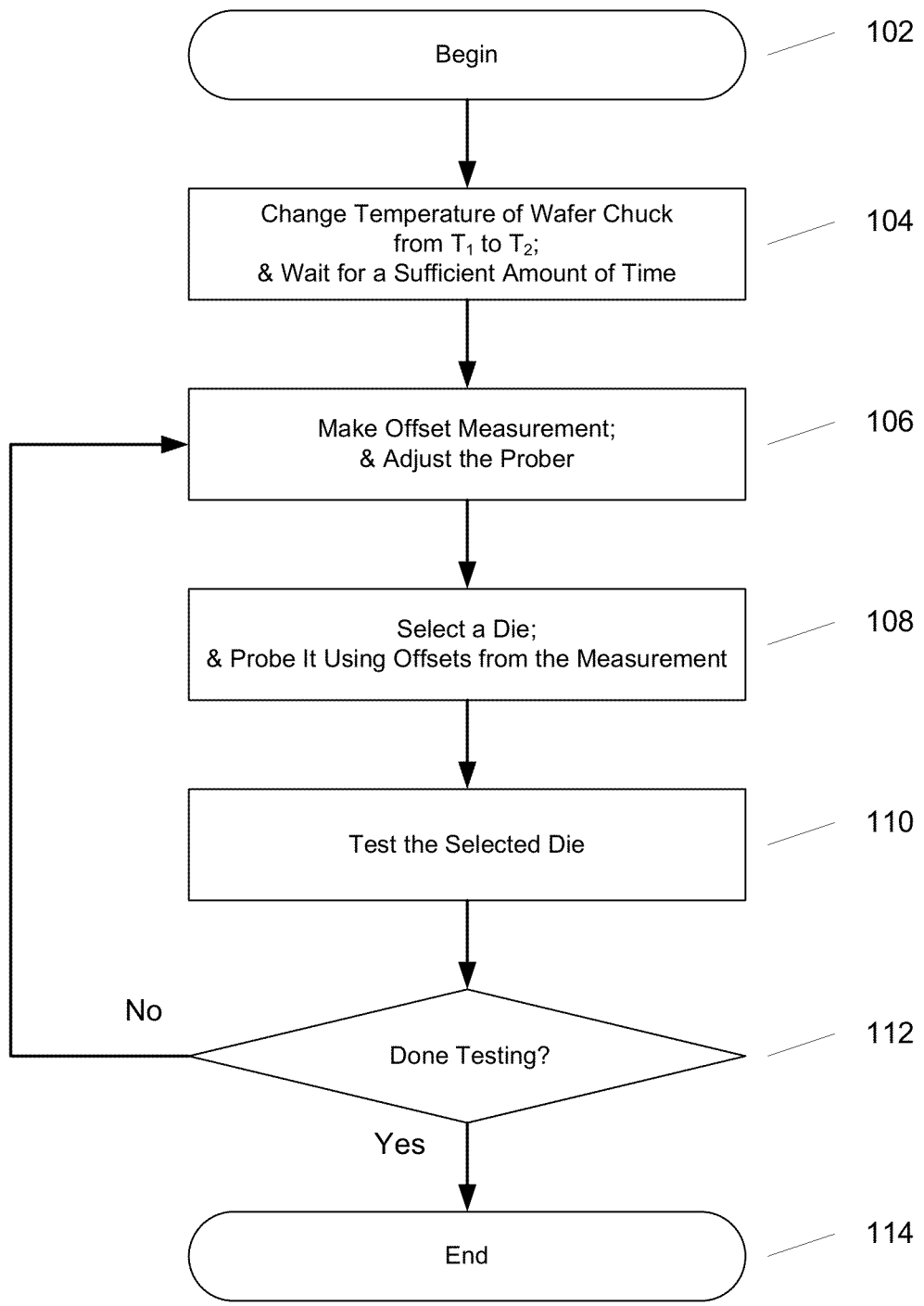
FIG. 1A shows a typical process for probing and testing dice in the prior art, after a change in temperature.
Figure 1B:
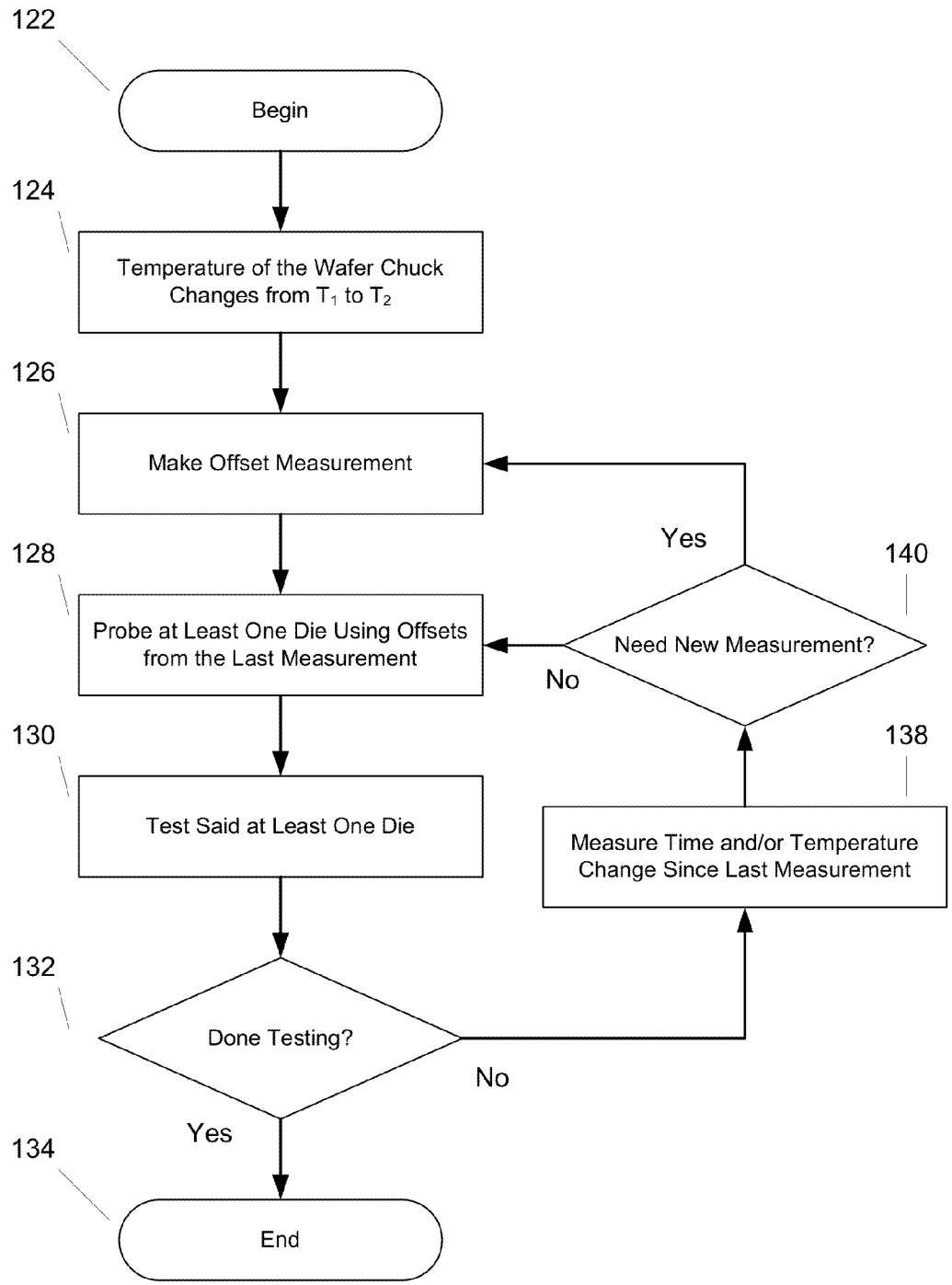
FIG. 1B shows another typical process for probing and testing dice after a change in temperature, as is currently done in the prior art.
Figure 2:
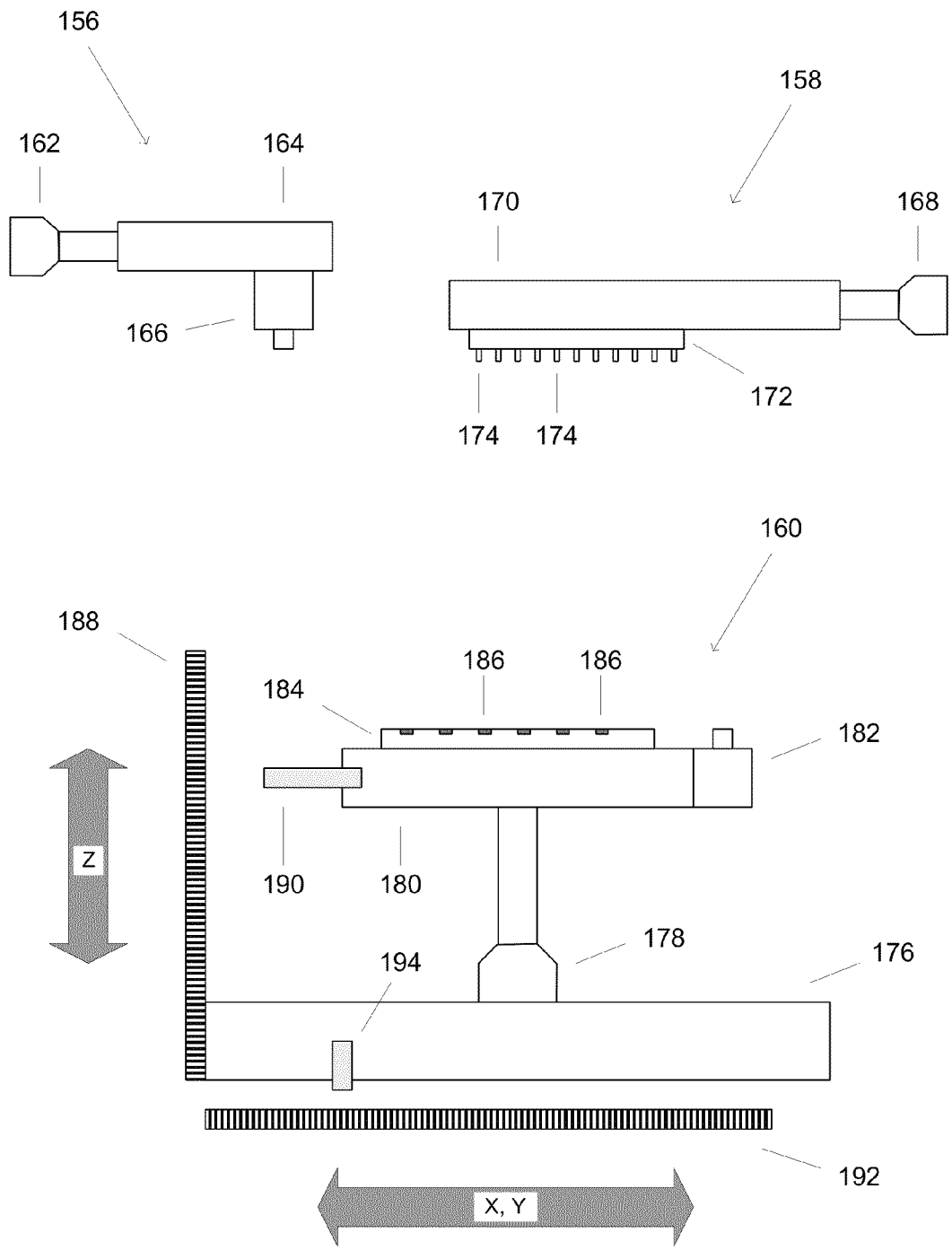
FIG. 2 shows a wafer prober which can be used to implement certain embodiments of the present invention.

FIG. 2 shows various components of an exemplary wafer prober to be used to describe various embodiments of the present invention. This schematic high-level drawing shows two major components of the exemplary wafer prober: Wafer chuck assembly 160 and probe card holder assembly 158. A camera assembly 156, which can be used to view or examine a wafer 184 mounted on the wafer chuck assembly 160 from the top, is also shown in the figure. These components may or may not be embodied as separate components, as illustrated in the drawing. In many wafer probers, these components will be coupled to each other by some means, for example, by sharing a common frame or frames. In some wafer probers, the camera assembly 156 and the probe card holder assembly 158 are attached to a single movable member, sometimes referred to as a bridge.

The camera assembly unit 156 comprises an optical or digital camera 166, a support member 164, and a motor assembly 162. The motor assembly 162 controls the position and direction of the camera 162 by moving the support member 164. As will be described further with respect to FIG. 3B, the motor assembly can control up to six degrees of freedom, three positional degrees of freedom and three rotational degrees of freedom. In some embodiments, the motor assembly may control only three spatial degrees of freedom and one angular degree of freedom around a predetermined axis. The bridge camera 166 may also be independently controlled to achieve finer precision in some wafer prober systems. In certain embodiments, the camera assembly unit 156 may be fixed to a frame and have no ability to be moved, and there is no motor assembly 162 in these embodiments.

The probe card holder assembly 158 comprises a probe card holder unit 170. The figure also shows a probe card 172 attached to the probe card holder unit 170. The probe card 172 includes multiple contact electrodes 174 called probe pins. These probe pins are arranged in a particular pattern designed for a particular wafer or a class of wafers. The probe card holder assembly 158 may also include an optional motor assembly 168 for controlling the position and orientation of the probe card 172 attached to the holder unit 170.

The third component shown in the figure, the wafer chuck assembly 160, comprises a wafer chuck 180 coupled to a motor assembly 178. In the figure, these units are placed on top of a stable platform 176; this stable platform is often part of a frame which is coupled to the probe card holder assembly and to one or more camera assembly units. The wafer chuck assembly 160 also includes an optical or digital camera unit 182 tied to a wafer chuck 180 for measurement and calibration purposes. In this embodiment, the camera 182 is placed so that the probe card 172 and the bridge camera 166 can be in viewing range of the camera 182. As will be explained further with regards to FIG. 3A, these camera units 166 and 182, are used for direct probe sensing (DPS) in some embodiments.

The wafer chuck assembly of FIG. 2 also includes an area for holding a wafer 184 mounted on the wafer chuck 180. The typical diameter of the wafer 184 is either 200 mm or 300 mm, and it includes multiple dice, whose numbers range from hundreds to thousands. Each die contains multiple test or bond pads 184 which provide electrical contacts. The primary purpose of wafer probing is to properly position the wafer 186 relative to the probe card 172 so that the pads 184 on the wafer make sufficient electrical contact with the probe pins 174. Typically, all pads on one die are brought into electrical contact with at least a set of probe pins 174 to allow electrical testing of the one die, although in certain cases, multiple dice may be simultaneously tested by causing probe pin to electrically contact a corresponding set of pads on several dice. It should be noted that even though a wafer prober comprising a wafer chuck assembly is often used for illustrative purposes throughout this disclosure, the present invention may be practiced for different types of probers such as those using film-frame or strip substrates. In that case, the term wafer chuck should be properly interpreted, for example, as a substrate holding unit. Other terms should be appropriately interpreted likewise. The figure also includes a schematic drawing of "rulers" 188 and 192 to be used to calibrate the system, especially to measure and calibrate the vertical and horizontal displacements of the wafer chuck 180 or the wafer 184. The figure shows zero CTE scales with scale read-heads 190 and 194. In some embodiments, diffraction grating is used.

Figure 3A:
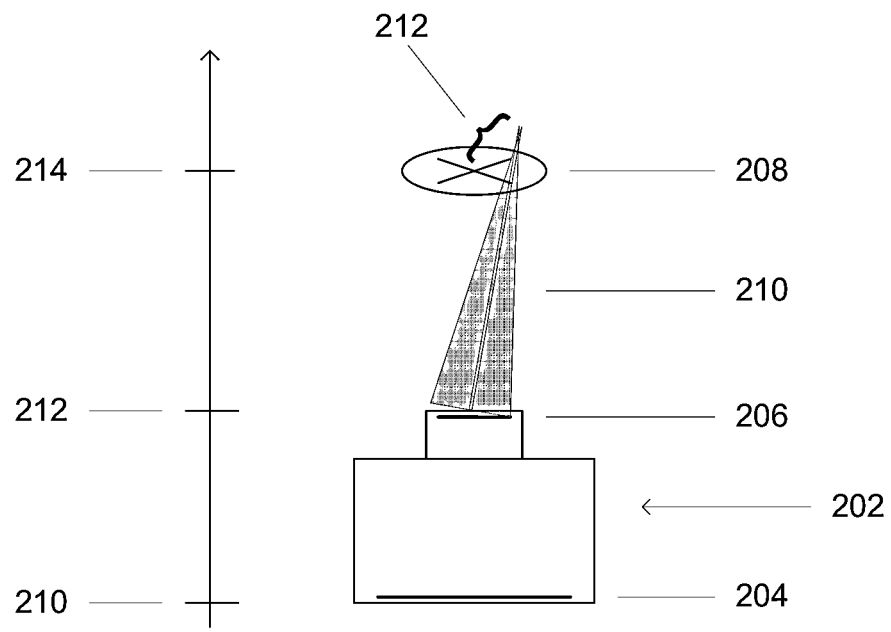
FIG. 3A illustrates an exemplary camera system to be used to calibrate the wafer prober system.

With respect to FIG. 3A, an exemplary camera system for direct probe sensing is shown. The optical or digital camera 202 comprises a lens 206 with a narrow focal range, which is illustrated as a cross mark 208 in the figure, and a film or a CCD screen 204. This type of camera can be used to calibrate the wafer prober system in certain embodiments. In some embodiments described herein, optical cameras are used to measure distances to certain well-defined points in the system. The figure defines relevant positions or dimensions, 210, 212, and 214, associated with the screen 204, the lens 206, and the focal point 208, respectively. In cameras used in some embodiments, the focal length, or the distance between 210 and 214, is adjustable. The figure shows a projected reticule 210 that can be viewed by a bridge camera for alignment. In some embodiments, the discrepancy 212 between the focal point of the projected reticule and the focal point/line of sight of the camera is used for alignment.

Figure 3B:
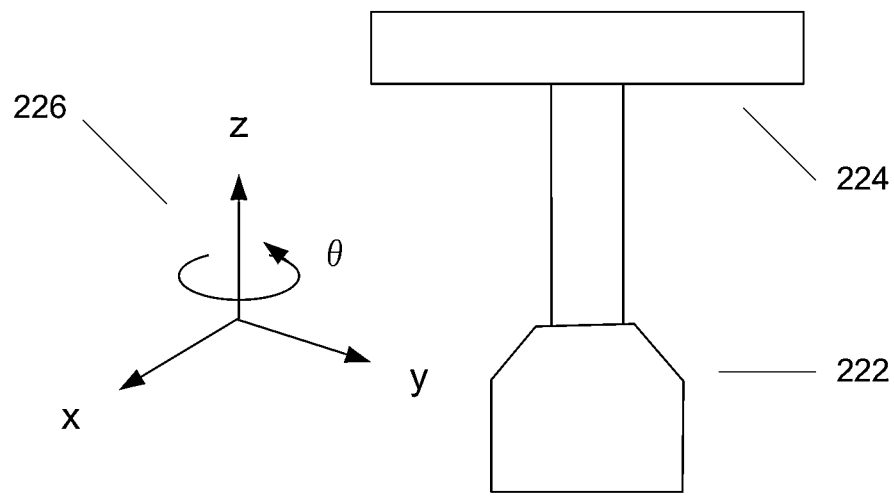
FIG. 3B shows an exemplary motor assembly controlling a wafer chuck.

FIG. 3B shows an exemplary motor assembly 222 used as a positioning system for various embodiments of the present invention. In this particular example, the motor assembly 222 controls a wafer chuck 224. However, the same or similar type of motor assemblies can be used for controlling various movable parts of the wafer probe system. For example, in FIG. 2, three motor assemblies, 162, 168, and 178, have been shown, to control the camera support unit 164, the probe card holder unit 170, and the wafer chuck 180, respectively.

A solid object in space has six degrees of freedom, three translational and three rotational. The motor assembly can control some or all of these six degrees of freedom using various methods, including one or more motors. For example, an electrically operated servo motor can be used to rotate the controlling object, and a linear motor can be used to move the object in one of the three orthogonal directions. In certain embodiments, more restrictive motor assembly can be used. For example, the particular motor unit shown in FIG. 3B controls three positional degrees of freedom and one angular degree of freedom around the main axis, i.e., z axis. This is illustrated as a coordinate system 226 on the left hand side of the drawing. The variable $\theta$ indicates the rotational degree of freedom around the z axis. The z axis is typically defined as the axis along which the distance of separation between the wafer's plane and the "plane" of probe pins is measured.

Typically a wafer prober is calibrated using measurement techniques such as the camera system shown in FIG. 3A and the position control techniques such as the motor assembly shown in FIG. 3B. Once the calibration is done, the system can be used for multiple probing and testing. When the testing condition is changed, however, the wafer probing, as well as measurement and calibration, should be redone since probe cards and wafers and other components involved in probing and testing might have different properties and characteristics under different physical conditions. In typical testing conditions, it takes several hours for the wafer prober system to reach equilibrium, or steady state, after a change in condition. For example, it takes an hour or more for a typical wafer prober system to reach thermally stable state after change in the temperature of a wafer chuck. Typically, only the wafer chuck is intentionally heated or cooled, but the rest of the system is affected by changes in the temperature of the wafer chuck through thermal conduction, convection, and radiation processes.

Different materials in the system typically have different susceptibilities, and they react differently, to changing conditions, further complicating the testing process during the transient period (e.g. the period of time after a temperature change of the wafer chuck and before temperatures of various components reach their respective asymptotic values). For example, when a controlled temperature of a wafer chuck is changed, different parts of the wafer prober, including probe cards, wafers, cameras, and various components connected either directly or indirectly to the wafer chuck platform, all expand or contract at different rates and with different end results.

FIG. 4 shows thermal characteristics of various materials that are relevant to probing and testing of dice in a wafer prober system. The table 242 includes silicon (Si), aluminum (Al), and silicon nitride ($Si_3N_4$). $Si_3N_4$ is often used as insulating material for the passivation, or glassivation, layer on a semiconductor wafer. Note that many wafer probers contain components made of various metal alloys such as copper (Cu) alloys. The table shows thermal conductivity, the coefficient of thermal expansion (CTE), and specific heat of these materials at room temperature. As shown in the table, they have wide range of values. For example, Al has much higher thermal conductivity and thermal expansion coefficients than Si.

This wide variation leads to inhomogeneous expansion and contraction of the system in response to change in temperature.

Turning now to FIG. 5, a simple example illustrating the effect of the temperature change on a wafer prober system is shown. In particular, the change in height of a wafer 184 mounted on a wafer chuck 180 is illustrated. FIG. 5A depicts a wafer chuck assembly 178 coupled to a stable platform 176 at one particular temperature, whereas FIG. 5B depicts the same wafer chuck assembly 178 at a substantially higher temperature. These figures show some exaggerated heights (displacements in the z direction) of the top layer of the wafer 184 at these two different temperatures. It also shows a schematic drawing of a scale 188 (e.g. zero CTE scale, diffraction grating, etc.), indicating that the height varies depending on the temperature. As shown in the figures, the height of a wafer 184 at a lower temperature is lower, as marked as 272 on the scale 188, than that of a wafer 184 at a higher temperature, as marked as 274 on the scale 188. The scale read-head 190 is typically mounted on thermally stable bracket (e.g. Invar™, Super Invar™, or other low CTE metals). In some embodiments, this change in height is automatically compensated for using the associated motor assembly (even while the probe pins are touched down on a die and while testing of this die is being performed). In some other embodiments, this change is explicitly accounted for during the calibration process. This will be further elaborated later, for example, with respect to FIG. 12.

Figure 6A:
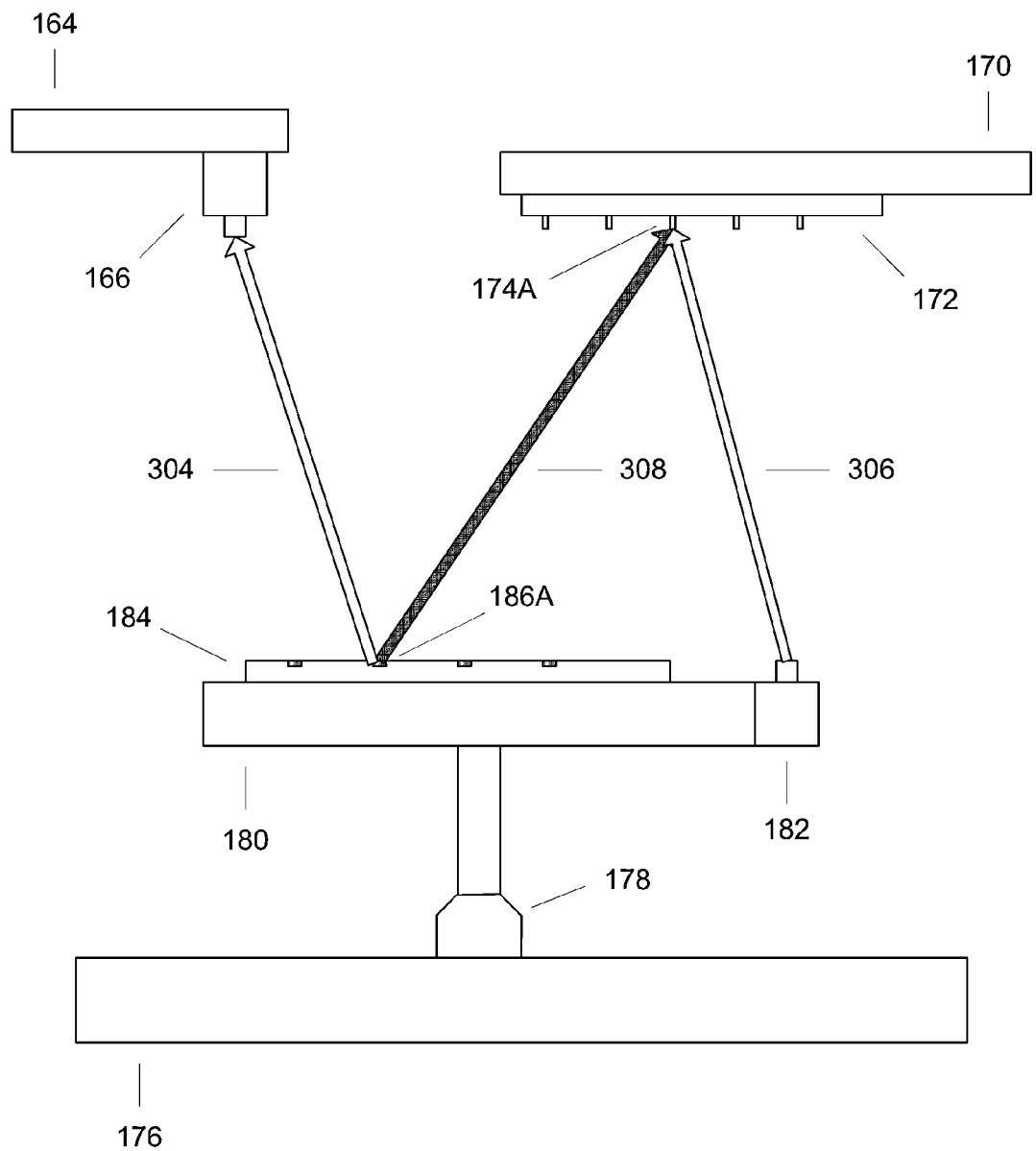
FIG. 6A shows some of the relevant components related to the wafer probing process.

Referring to FIG. 6A, some of the components relevant to the probing process are shown. The figure shows a top DPS camera 166, pointing downward, attached to camera holding unit 164, a probe card 172 mounted on support unit 170, and a wafer 184 mounted on wafer chuck 180. The wafer chuck 180 has an additional DPS camera 182, as in FIG. 2. This camera is used for viewing the bridge camera 166 and the probe card 172. The wafer chuck 180 is coupled to the motor assembly 178, which is in turn mounted on a stable platform 176. The bridge camera assembly 164 and the probe card assembly 170 may be independently positioned and oriented using other motor assemblies. This figure defines three displacement vectors, 304, 306, and 308. The vector 304 is defined to be the displacement from a particular test or bond pad 186A to the tip of the top camera 166. The vector 306 is a displacement from the tip of the wafer chuck camera 182 to a particular probe pin 174A. The vector 308 is a displacement from the pad 186A to the probe pin 174A. It should be noted that these vectors are dynamic variables in the sense that they are dependent on positions of various components as well as their temperatures at any given moment.

Figure 6B:
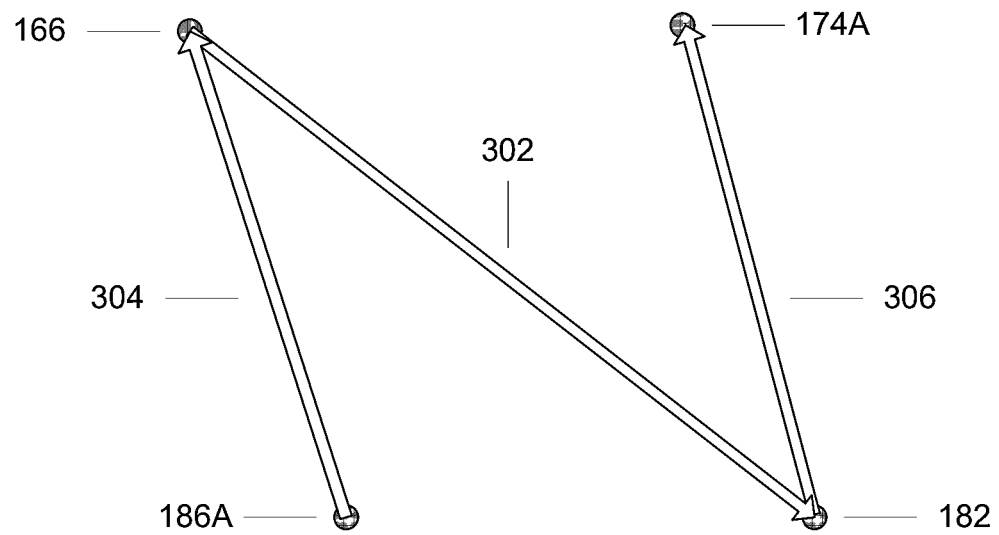
FIGS. 6B and 6C illustrate displacement vectors defined between various components shown in the exemplary wafer prober system of FIG. 6A.
Figure 6C:
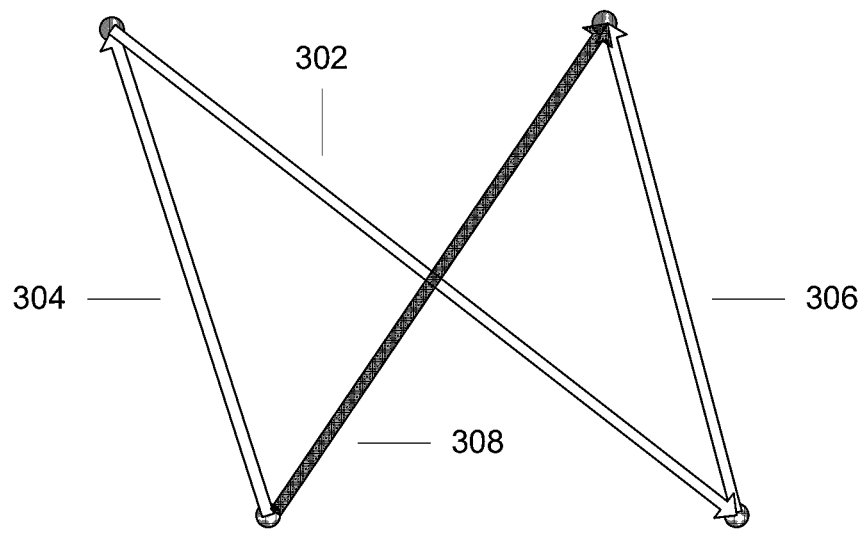

FIG. 6B defines one more displacement vector 302 from the tip of camera 166 to the tip of camera 182. In this diagram, the locations of the relevant components, i.e., the tip of the top camera 166, the tip of the wafer chuck camera 182, the pad 186A, and the probe pin 174A, are all drawn as circular dots for the sake of clarity. The vectors involving cameras, namely, displacements 302, 304, and 306 can be measured, in general. On the other hand, the vector 308, which is used for probing, may not be measurable. However, this vector, for example, can be easily computed using simple geometric relationships between other relevant vectors. This is illustrated in FIG. 6C. It can be easily seen that the vector 308 from the pad 186A to the probe pin 174A is a sum of the three vectors, 304, 302, and 306. It should be noted that this is a mathematical identity, which is independent of any external conditions. In particular, this identity holds at all temperatures.

Figure 7A:
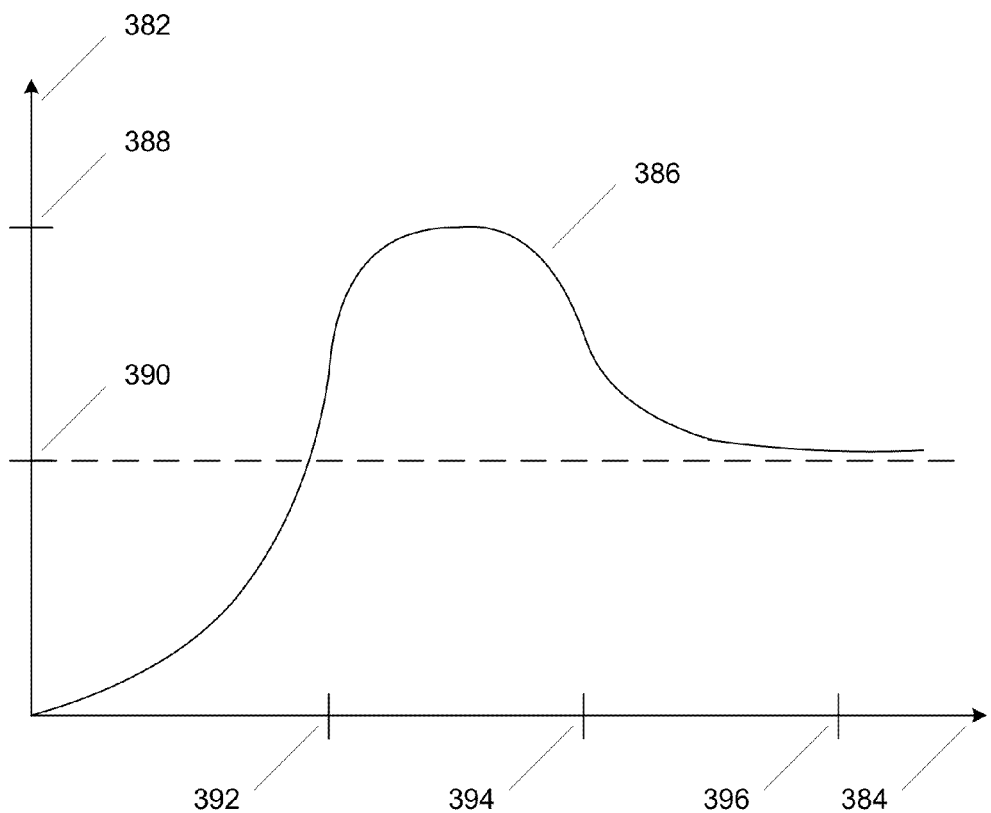
FIG. 7A is a graph illustrating a typical thermal expansion curve for a change in a pin-to-pad distance (or any other relevant displacement vector relevant for probing), or alignment shift, as a function of time.

FIG. 7A illustrates a typical thermal expansion curve for a distance, for example, between a probe pin to a pad, e.g., the magnitude of vector 308 shown in FIG. 6, as a function of time. The horizontal axis 384 represents time starting from the moment when the wafer chuck reaches the target temperature. The vertical axis 382 represents the alignment shift, or the change in the distance or the size of an exemplary displacement vector relevant for probing. After increase in temperature, the system typically expands, as shown in the figure as a curve 386. Note that this curve is for illustrative purposes only, and it is not based on real data. The magnitude of the expansion, that is, the value along the vertical axis, is roughly linearly proportional to the target temperature change of the wafer chuck. For a case where the target temperature change is around 100° C., the initial slope of the curve is typically about 1 micron/minute. Note that the figure is not drawn in any particular scale.

The curve shown in the figure illustrates a rather complex nature of thermal relaxation in a typical prober system. As discussed earlier, due to the inhomogeneity of the system, the curve deviates substantially from a simple exponential relaxation. The curve 386 shown in the figure, for example, shows at least two distinct relaxation modes, one defined by a time constant 392 and the other defined by a time constant 394. This particular exemplary curve exhibits a maximum 388 between these two characteristic times. The curve, after a sufficiently long time, marked by a tick 396 in the figure, eventually settles to a steady plateau 390, which is the asymptotic, or steady-state, value at the new temperature. In this state, all components of the prober system will have reached their respective temperatures as a result of the target temperature initially set only for the wafer chuck, or the substrate holding unit.

Figure 7B:
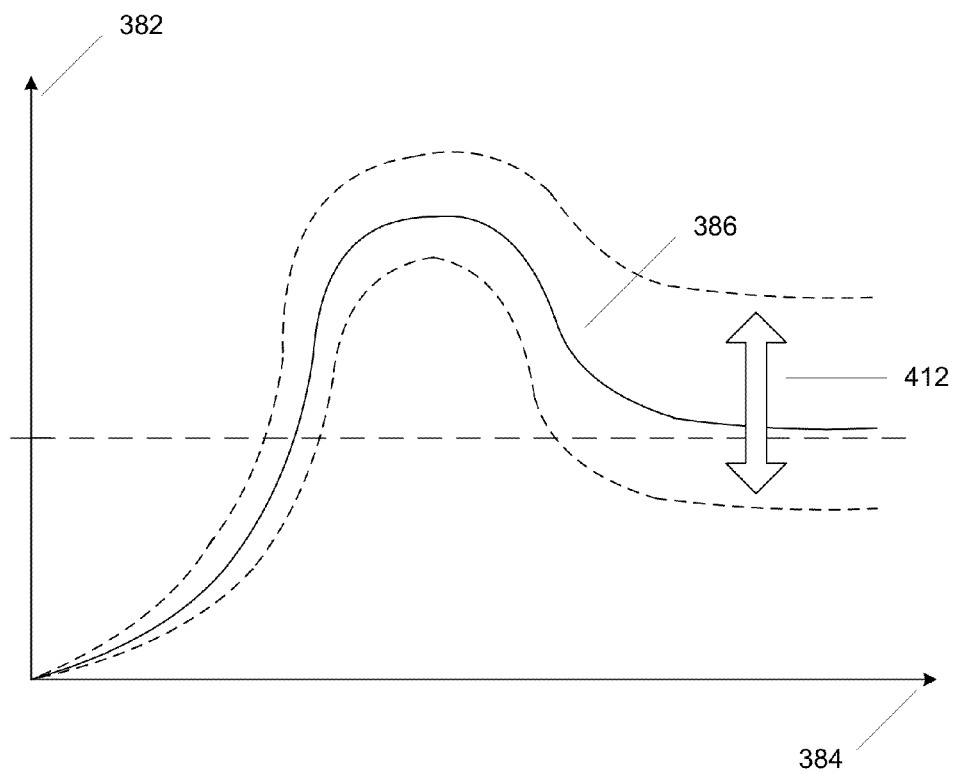
FIG. 7B shows a graph of FIG. 7A with "error bars".

FIG. 7B shows "error bars" around the curve 386. The error increases as a function of time, as illustrated by broken line envelope in the figure. The steady state error is marked with arrow 412 in the figure. The "error" in the figure can be interpreted as due to variations from trial to trial. That is, the same system in response to the same temperature change might exhibit slightly different behaviors and result in different values of a relevant distance or dimension. This is partly due to the "noise" inherent in the system and also due to various measurement errors. This figure illustrates, among other things, the fact that the thermal response of a typical prober system is not generally deterministic.

Figure 8A:
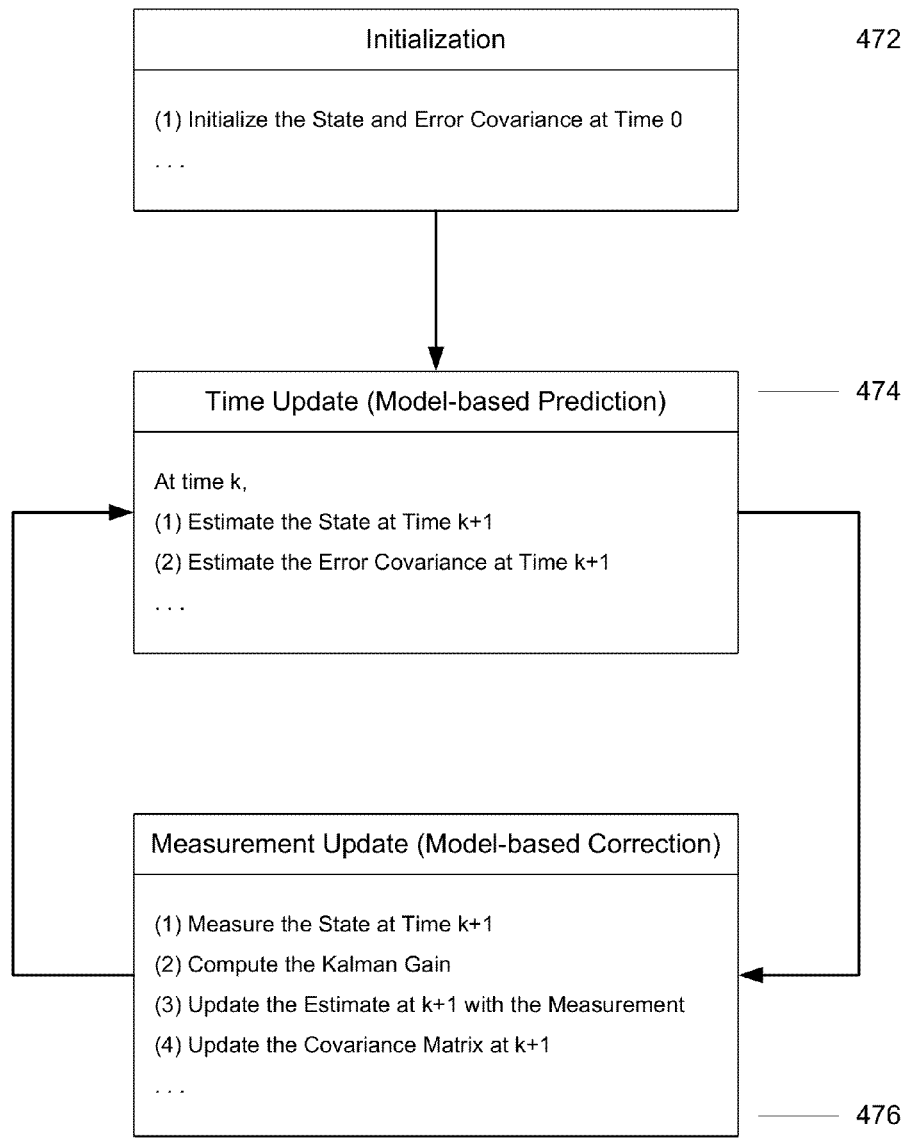
FIG. 8A shows a dynamic model used in an embodiment of the present invention. In particular, it shows some operations of a linear filter ("prediction", "smoothing (correction)", etc.).

With reference to FIG. 8A, a dynamic model used in an embodiment of the present invention is illustrated in a simple flow-chart form. In particular, it shows three essential components of the linear filter operations, namely, the initial estimation 472, the (model-based) prediction 474, and the (model-based) correction 476 operations.

A typical modeling process normally starts by defining state variables relevant to describe the system. This will be further elaborated with respect to FIG. 10. As shown in the figure, the model is used first by setting the initial values for the state variables, as indicated in a block 472. In some embodiments, values based on any previous trial can be used. In some other embodiments, any random values may be used. The error covariance matrix is also initialized in this block as indicated in the figure. Once the model is initialized, the next two sets of operations, 474 and 476, are repeated in preset time intervals. First, the "prediction" 474 is performed. According to an embodiment of the present invention, the prediction comprises estimating the values of the state variables at the next time segment k+1, as indicated in block 474. Next, the state variables are measured or otherwise computed at the next time segment, and the "correction" 476 is performed based on these measurements. This pair of operations is then repeated at subsequent times as indicated by the loop in the figure. Note that the termination condition is not shown in the chart. In some embodiments, this process will continue indefinitely. In some other embodiments, it will be terminated once the system reaches an overall equilibrium or steady state.

Figure 8B:
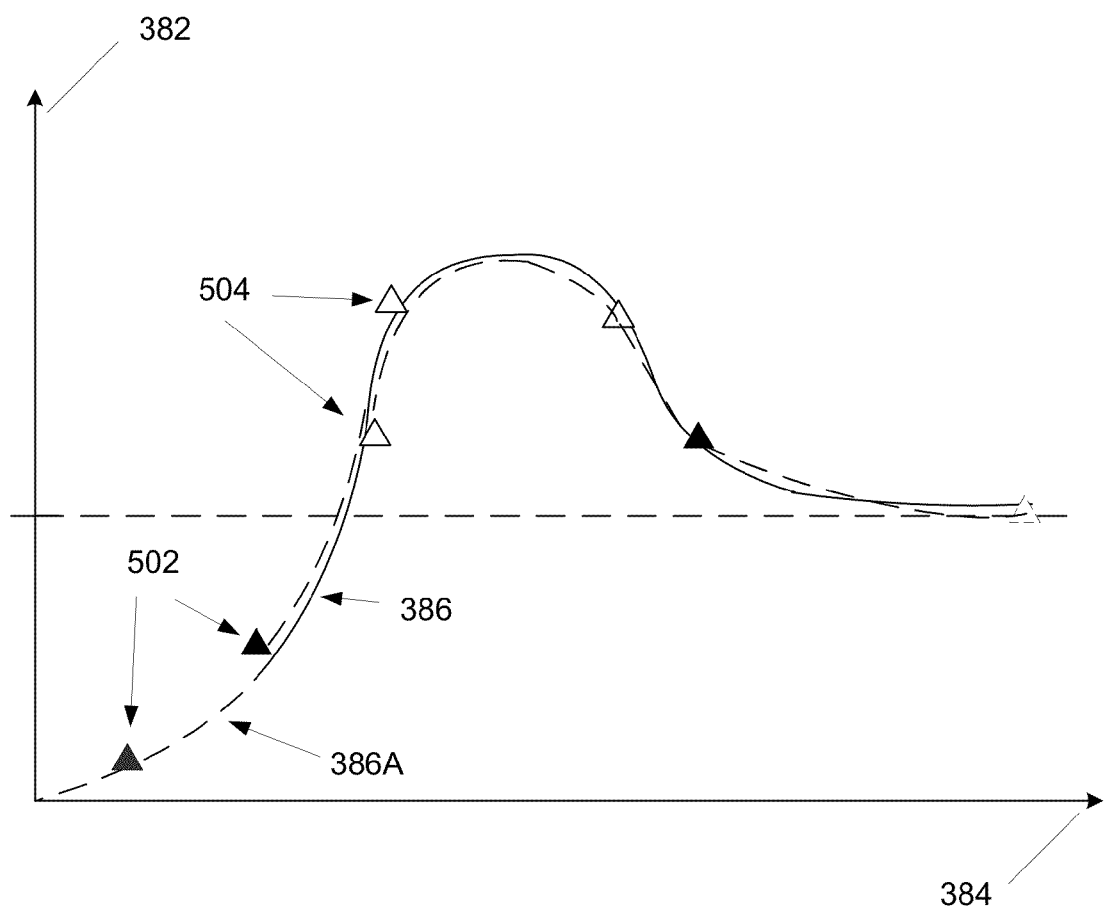
FIG. 8B illustrates an exemplary process for measuring, estimating, and updating a pin-to-pad distance, which is based on the example shown in FIG. 7A.

FIG. 8B illustrates an exemplary process for updating a pin-to-pad registration. The graph is based on the example given in FIG. 7 with the pin-to-pad displacement curve 386 drawn against the time 384 and the distance 382 axes. The solid line 386 represents the "actual" shift, whereas the broken-line curve 386A indicates the model-based aposteriori (after measurement as opposed to the prediction prior to the measurement) estimates. As noted in the figure, this exemplary process utilizes two different modes of updates to dynamically "correct" the state of the model (i.e., operations 476 in FIG. 8A). In typical prober systems, "pin updates" (denoted by hollow triangles 504 in the figure), which involve measuring only pin-camera distances, take much less time than "full bridge updates" (filled triangles 502), which include measurements of pin-camera, camera-bridge, and bridge-die displacements. (E.g., 10 to 15 seconds for a pin update as opposed to a full minute for a full bridge update.) At any given moment, less expensive pin updates might suffice to keep the system within the preset error tolerances. This is reflected in the exemplary process in FIG. 8B. In the initial stage, more full bridge updates 502 are done as shown in the figure. However, its frequency is gradually reduced as time passes, and it is performed only occasionally. In this example, either update is triggered when the variance of one or more displacement vector components exceeds the preset threshold.

So far we have introduced various relevant components of the prober system and defined some pertinent concepts and models. Turning now to FIGS. 9 through 12, some of the embodiments of the present invention are described with reference to various flow charts.

Figure 9:
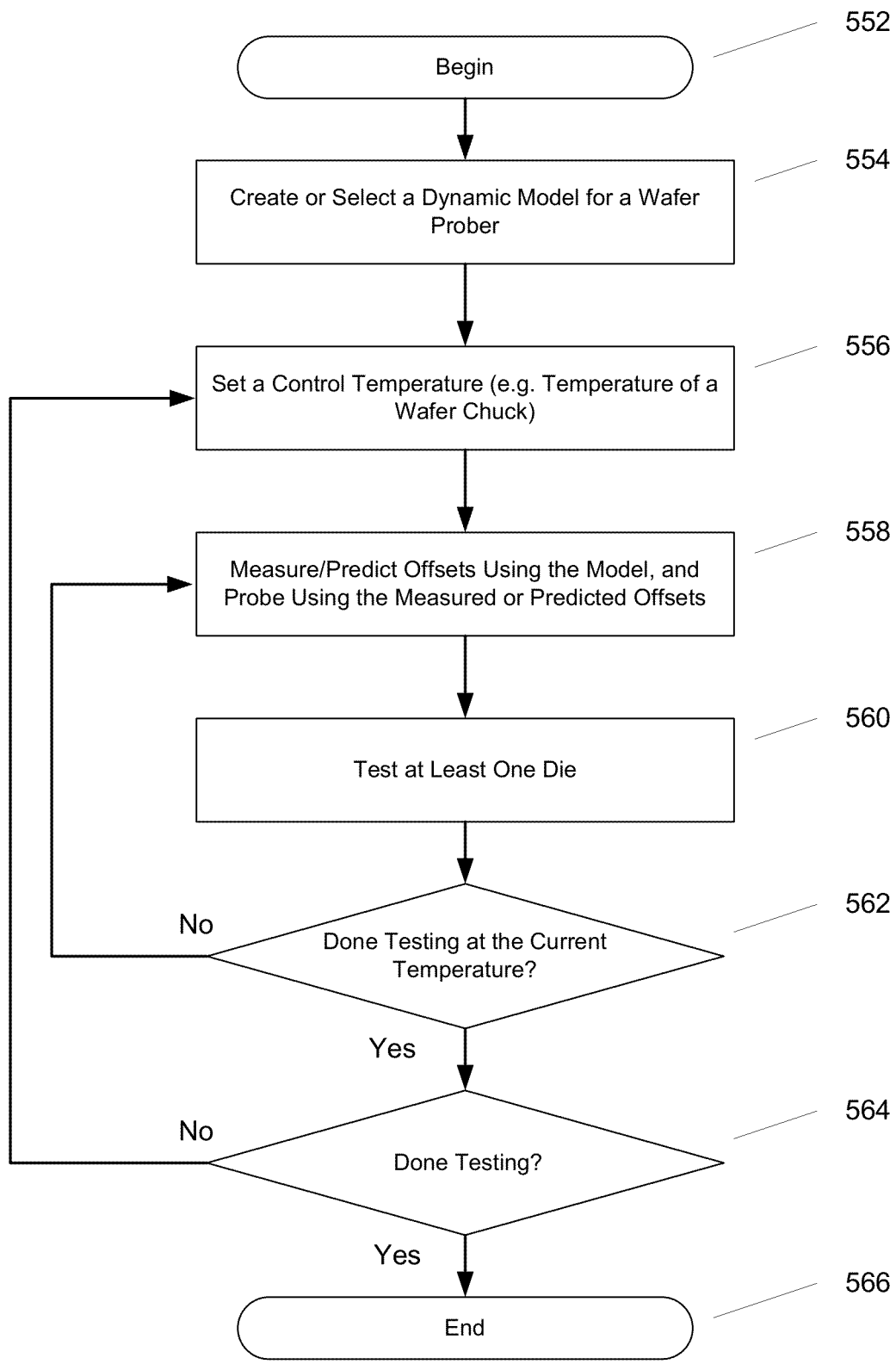
FIG. 9 is a high-level flow chart illustrating an embodiment of the present invention.

FIG. 9 shows a high-level flow chart depicting an exemplary scenario using an embodiment of the present invention. This example process, defined between the beginning and ending blocks 552 and 566, starts by defining a dynamic model at block 554. The model can be dynamically created for a given wafer to be tested on a given type of wafer prober, or the models can be pre-constructed for various different types of wafers on various different types of wafer probers and an appropriate model can be selected later for use. In some embodiments, the model can be associated with a specific probe card/tester family. This operation will be further explained with reference to FIG. 10. This exemplary embodiment of the present invention allows the user to do probing and testing at multiple temperatures without having to wait for the system to reach a thermal equilibrium and/or without the need for frequent offset measurements and re-calibrations.

The probing process shown in the chart of FIG. 9 starts by setting a control temperature at block 556. In many cases, the temperatures of semiconductor wafers are controlled by changing the temperature of the wafer chuck during the testing process. Once the temperature of the wafer chuck reaches the target temperature, the wafer system is re-calibrated. Then, at a particular time during the testing process, a die or a set of dice is selected and probed, as indicated in block 558. The probing can be done based on measurement or based on estimation using the current model, selected at 554. When the testing of the selected die or dice is done, 560, the process can continue at the same temperature, following the No branch at 562. Once the testing is completed at one particular temperature, following the Yes branch at 562, the process can be repeated at different temperatures, following the No branch at 564. Otherwise, the overall process terminates at block 566, following the Yes branch at 564.

Figure 10:
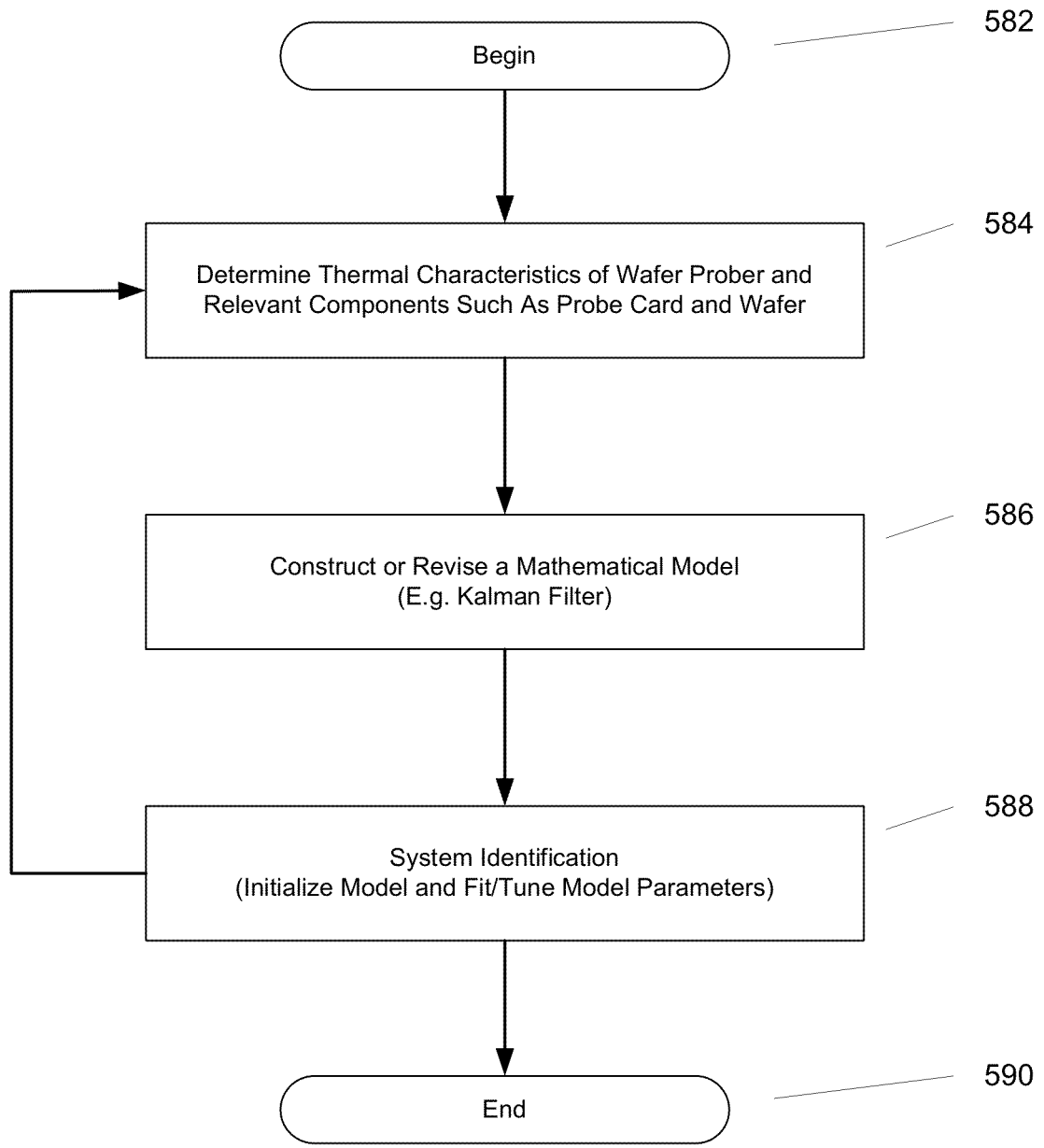
FIG. 10 illustrates an exemplary process for creating a mathematical model.

FIG. 10 illustrates an exemplary process for creating a mathematical model to be used for probing purposes. Again, the overall process is defined between two blocks 582 and 590. As shown by the loop in the figure, including blocks 584, 586, and 588, the model creation is typically an iterative process. A modeling process typically starts by defining relevant state variables. For purposes of wafer probing, these state variables may comprise positional components of various displacement vectors shown, for example, in FIG. 6. In the first process block 584, these variables are determined and data is collected as to the thermal characteristics of various materials such as thermal conductivities and thermal expansion coefficients. This analysis is used to define the dimensionality of the model. Then, a dynamic model for the chosen state variables is created based on various necessary assumptions and relevant measurement data, at block 586. Many dynamic models used for temporal predictions such as Kalman filter include at least one parameter (a time constant or transport lag, for instance) that can be fitted using various measurements. Dynamic models illustrated in FIG. 10 also include fittable parameters. These parameters are fitted at block 588, for a particular wafer prober apparatus. This task is usually called system identification. As mentioned earlier, a dynamic model created this way is typically specific to a particular probe card/tester family, including the "ring carrier" support for that family.

According to an embodiment of the present invention, the following stochastic model is used for the state vector, e.g., a pin-to-pad alignment shift, x(t), and its measured value $z_k$ at (discrete) time $t=t_k$, $$\dot{x}(t)=A(t)x(t)+B(t)u(t)+G(t)w(t)$$

$$z_k=Hx_k+v_k$$

where $x_k=x(t_k)$ at time $t=t_k$. Note that these are generally multi-component, or matrix, equations. For example, x(t) might be a column matrix with three elements representing x, y, and z components of a pin-to-pad displacement vector. Likewise, u(t), w(t), $z_k$, $v_k$, A(t), B(t), G(t), and H are matrices of appropriate dimensions. u(t) is the chuck temperature at time t and w(t) is a noise source with covariance Q. In some cases, such as in Kalman filter, the noise is assumed to be Gaussian white noise with zero mean. The measurement noise $v_k$ at time $t=t_k$ is also assumed to be Gaussian with zero mean and variance R in some cases. Some of the parameters, such as Q, R, and H, are fittable parameters in this model. The above dynamic state model has been chosen for a particular system based on the system identification, and it is presented here as an example only. As is well known to people of ordinary skill in the related art, different systems might yield different models, in particular, different stochastic equations with different parameters.

According to this particular model, the filtering and prediction equations take the following form:

$$\hat{x}_{m|k}=\Phi(t_m,t_k)x_{k|k}+\int_{t_k}^{t_m}dt\Phi(t_m,t)B(t)u(t)$$

$$\Sigma_{m|k}=\Phi(t_m,t_k)\Sigma_{k|k}\Phi(t_m,t_k)+\Theta(t_m,t_k)Q\Theta(t_m,t_k)$$

$$\hat{z}_{m|k}=H\hat{x}_{m|k}$$

where the circumflex indicates that they are predicted values. $\hat{x}_{m|k}$ is the predicted state at time $t_m$ given all the measurements up to and including time $t_k$ ($t_m \geq t_k$), and $\Sigma_{m|k}$ is the covariance of the state estimate at time $t_m$, given all of the measurements up to and including time $t_k$, $\Sigma_{m|k} = E[(x_m - \hat{x}_{m|k})(x_m - \hat{x}_{m|k})]$ where $E[\bullet]$ indicates the expectation value and the argument should be interpreted as an appropriate matrix multiplication. $\Phi(t_m, t_k)$ is the convolution integral of the state transition matrix and $A(t)$ between time $t_k$ and $t_m$, and $\Theta(t_m, t_k) = \int_{t_k}^{t_m} dt \Phi(t_m, t) G(t)$ These filtering and prediction equations are obtained, for example, by minimizing the errors between the prediction and measurement values of the state vector at time $t_k$.

Various extensions are also possible. In some embodiments, the state vector $x(t)$ is augmented with an idempotent error state vector, $e(t)$, to include the effects of slowly varying system biases. These biases typically result from external "inputs", such as the ambient temperature fluctuation or the heat dissipation through various components coupled to the wafer prober (e.g. the tester). In this case, the augmented state vector $\bar{x}$ takes the following form, $$\bar{x} = \begin{bmatrix} x \\ e \end{bmatrix}$$

where x itself is a column matrix with possibly multiple elements as indicated before, and e comprises two components $e_1$ and $e_2$ in this exemplary embodiment. The model incorporates $e_2$ as a random walk input and $e_1$ as a low-pass filter. The variances of $e_1$ and $e_2$ increase linearly with time, typical of a Brownian motion. In some realizations of this particular model, the time constant of the system is set to the inverse of the smallest eigenvalue of $A(t)$. By adding $e_1$ to the measurement, the slowly varying system bias has been incorporated into the model in predicting the state of the system. According to this particular model, the variance of the alignment shift prediction, $\bar{h}\Sigma(t)\bar{h}$, increases with prediction time. In some embodiments, this alignment shift prediction is used to trigger new alignment measurements. This particular design causes the alignment measurement to take place (say, periodically or semi-periodically) even when the system is in a quiescent mode.

In the following description, various embodiments of the present invention will be discussed, which use some type of dynamic models for estimating future values of various state variables relevant for probing, created by a process similar to that shown in FIG. 10.

Figure 11A:
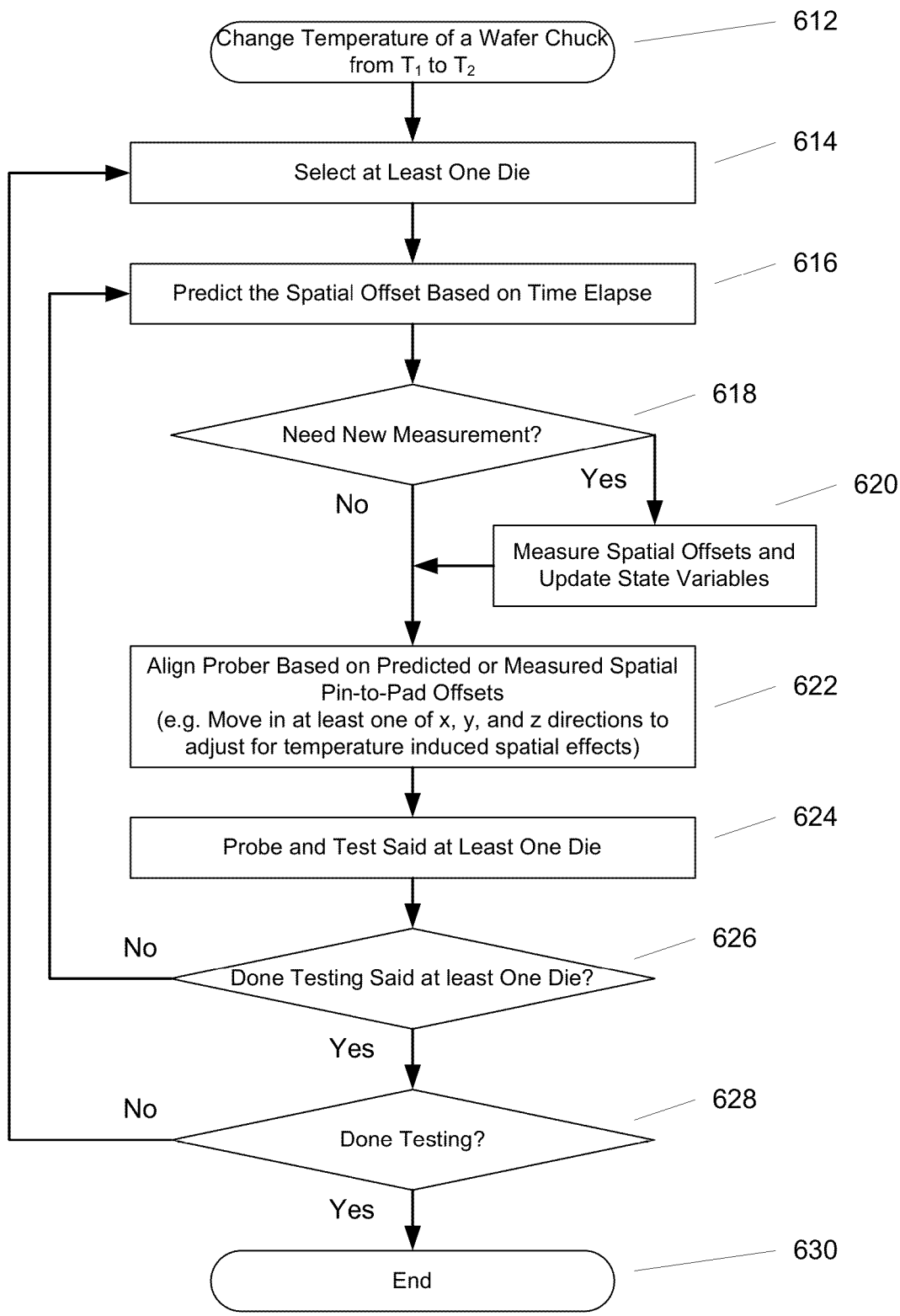
FIG. 11A is a flow chart illustrating an exemplary probing process during the transient period according to an embodiment of the present invention.

FIG. 11A is a flow chart illustrating an exemplary probing process during the transient period according to an embodiment of the present invention. The chart starts when the temperature of the wafer chuck changes from $T_1$ to $T_2$, at block 612, and it describes the process until the test is done at this new temperature, terminating at block 630. The chart shows two global loops. The outer loop, starting at block 614 and ending at block 628, describes a process for testing one or more selected dice. The inner loop, starting at block 616 and ending at block 626, on the other hand, illustrates various possible operations during the testing of the selected die or dice. At block 616, based on the time elapsed since the last measurement, one estimates new spatial offset values of the state variables that are necessary for probing. According to the embodiment illustrated in this process, this is done using the dynamic model. If these values fall within a preset error tolerance, following the No branch at 618, these values are used for the next probing, 622. Otherwise, a new measurement is performed (to determine the spatial offsets necessary to compensate for the continuing change in temperature of one or more components in the wafer prober) and new values are obtained at 620. These new measured values will be used for the next probing and testing process, at blocks 622 and 624, and they will also be used for updating the state of the model to incorporate the new information from the measurement, as shown in block 620. In some embodiments, this block comprises the various operations described in FIG. 8. This process can be repeated following the No branch at 626 until the testing of the selected die or dice is completed.

Regarding the decision block 618, one possible criterion would be to measure the elapsed time ($\Delta t$) and the predicted pin-to-pad alignment shift ($\Delta P$) of a relevant component such as the probe card, 172 in FIG. 6A, since the last measurement, and compare them with preset values ($\Delta t_C$ and $\Delta P_C$, respectively). For example, Is $|\Delta P|^2 > |\Delta P_C|^2$

OR $\Delta t > \Delta t_C$ and $t < t_C$?

where $|\Delta P|^2$ is the predicted variance in pin-to-pad alignment and $|\Delta P_C|^2$ is the maximum allowable variance. A similar checking is also done with respect to time in this example. That is, if the time elapsed since the moment of the temperature change of the wafer chuck (t) is larger than a certain value ($t_C$), which is typically set to a value that is a fraction of the relaxation time constant of the system, for instance 396 of FIG. 7A, the comparison returns false, meaning that no new measurement is needed. $t_C$ is typically set to limit the predicted pin-to-pad alignment shift to a fraction of the desired alignment accuracy. In some embodiments, a simpler criterion might be used. For example, the number of dice probed might be counted between measurements, and when it reaches a preset value a new measurement is performed and the counter is set to zero. It should be noted that, in some embodiments, more elaborate mathematical formulation is used for various decision criteria, for example, as explained with reference to FIG. 10.

Figure 11B:
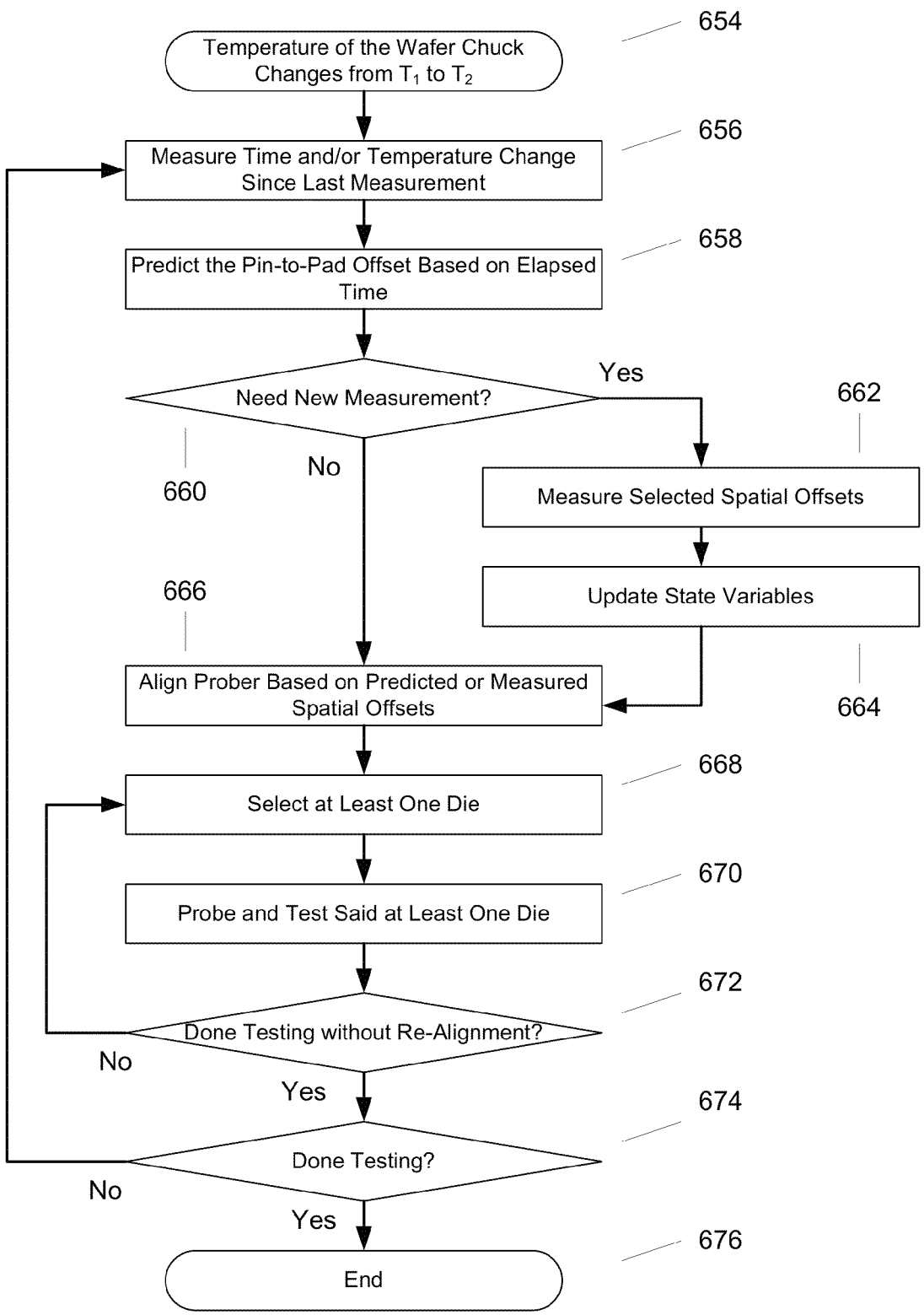
FIGS. 11B and 11C show flow charts showing different exemplary probing processes in alternative embodiments.

FIG. 11B shows a flow chart showing a different exemplary probing process in an alternative embodiment. The process shown in the figure starts from block 654, where the control temperature is changed to a new temperature ($T_2$), and it ends at 676 when the testing is completed at this new temperature. The flow chart shows two main loops, or three distinct loops if a branching condition 660 is included, as in the embodiment illustrated in FIG. 11A. The loops in this example, however, are arranged differently than those in FIG. 11A. For instance, in the inner loop of this embodiment, blocks 668 through 672, testing and probing of, possibly, multiple dice is done without re-calibration.

After the change in the control temperature, the process continues by measuring the time and temperatures of various relevant components in the wafer prober system, at 656. Using a model, relevant state variables, such as a distance between a particular probe pin and a particular test or bond pad, are first estimated (474 of FIG. 8). If the estimated values can be used within predetermined error tolerance, at 660, the process continues to the next block 666, where the system is re-aligned based on the estimated values. Otherwise, new offset values are measured, 662, and also the state of the model is updated, 664, using these measured values and the estimated values (476 of FIG. 8). Based on these newly measured or estimated values, probing and testing can be done on at least one die or a set of dice, as indicated by the loop, 668 through 672, in the flow chart. This particular scenario according to this embodiment can be useful when the testing time for one die is relatively short, that is, much shorter than the measurement and calibration time, which is typically of the order of one minute. On the other hand, the example of FIG. 11A can be more useful in cases where the time for testing a die is relatively long.

Figure 11C:
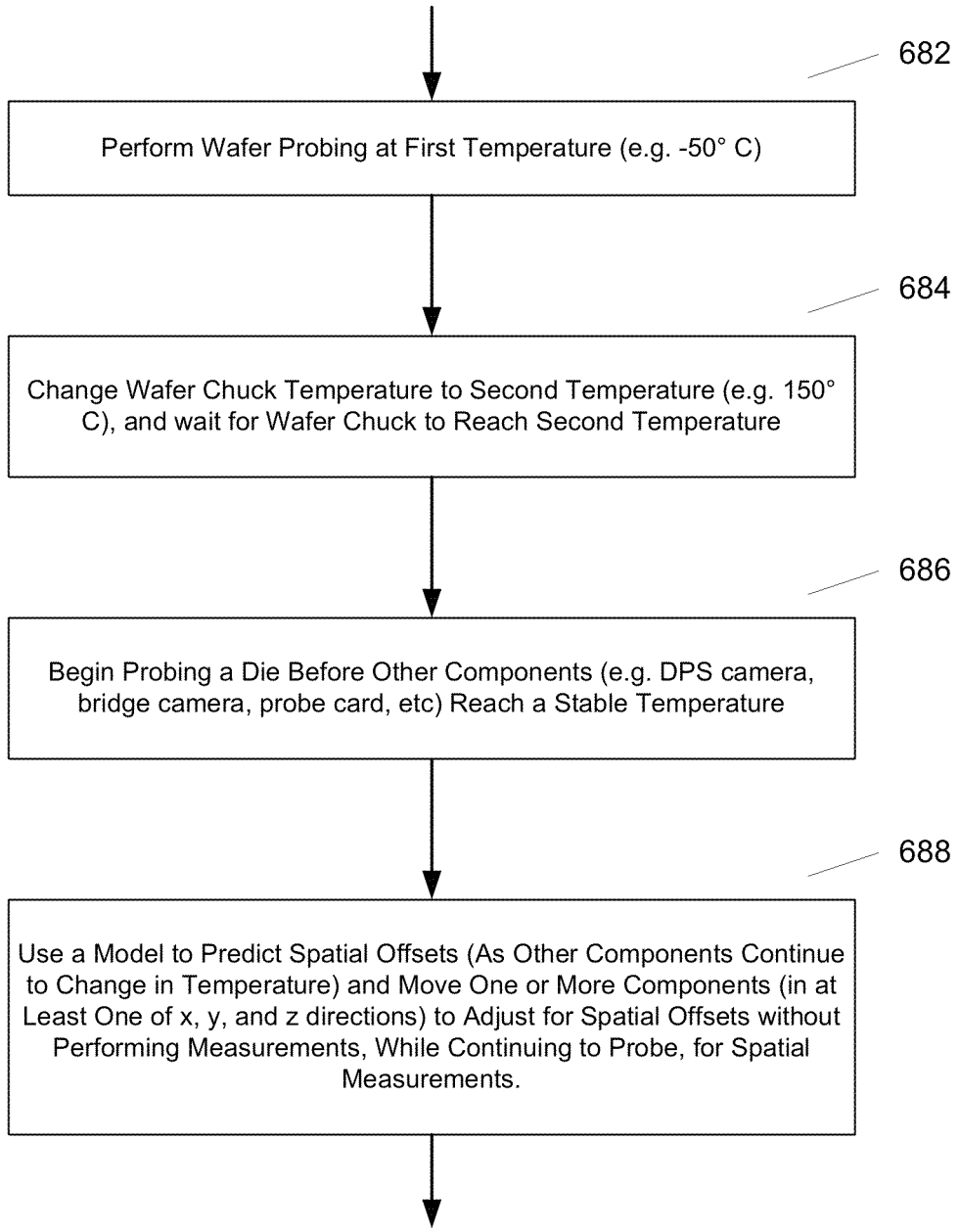

FIG. 11C illustrates another aspect of an embodiment of the present invention. The flow chart in the figure shows a part of the process for probing and testing according to the embodiment. This flow chart, in particular, emphasizes the fact that the probing can be done at multiple temperatures without having to wait for the whole wafer prober system to reach thermal equilibria, or otherwise thermally stable states. In the figure, block 682 describes a probing and testing process at one temperature, e.g., at −50° C. Then the temperature of the wafer chuck is changed to another temperature, e.g. 150° C. above freezing, at 684, and probing and testing is done using a dynamic model, at 686 and 688, while other components in the system are still adjusting to the temperature change.

Figure 12A:
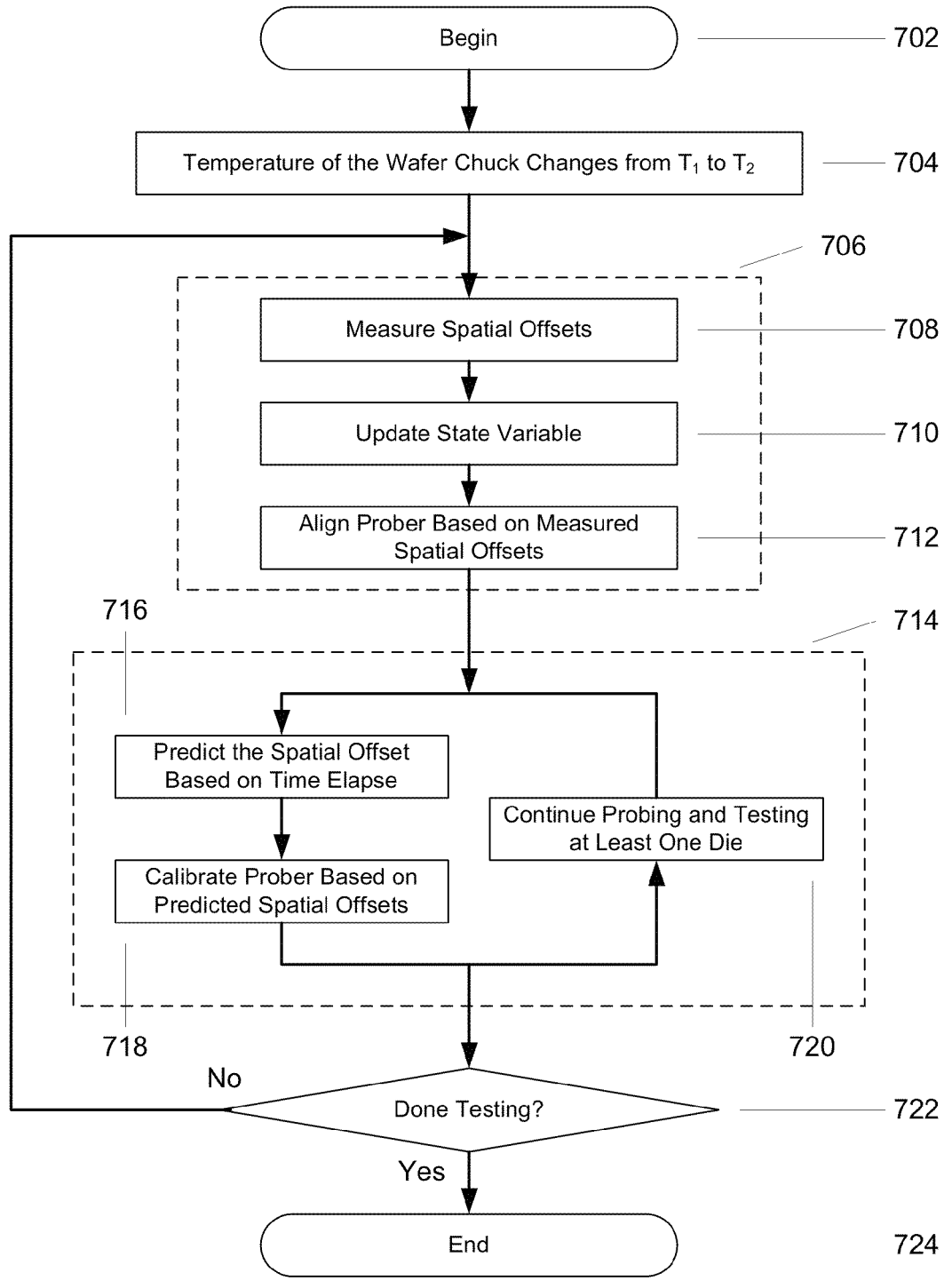
FIGS. 12A-12C show various exemplary probing processes according to certain embodiments of the present invention. In these embodiments, the wafer prober can be continuously adjusted during probing.
Figure 12B:
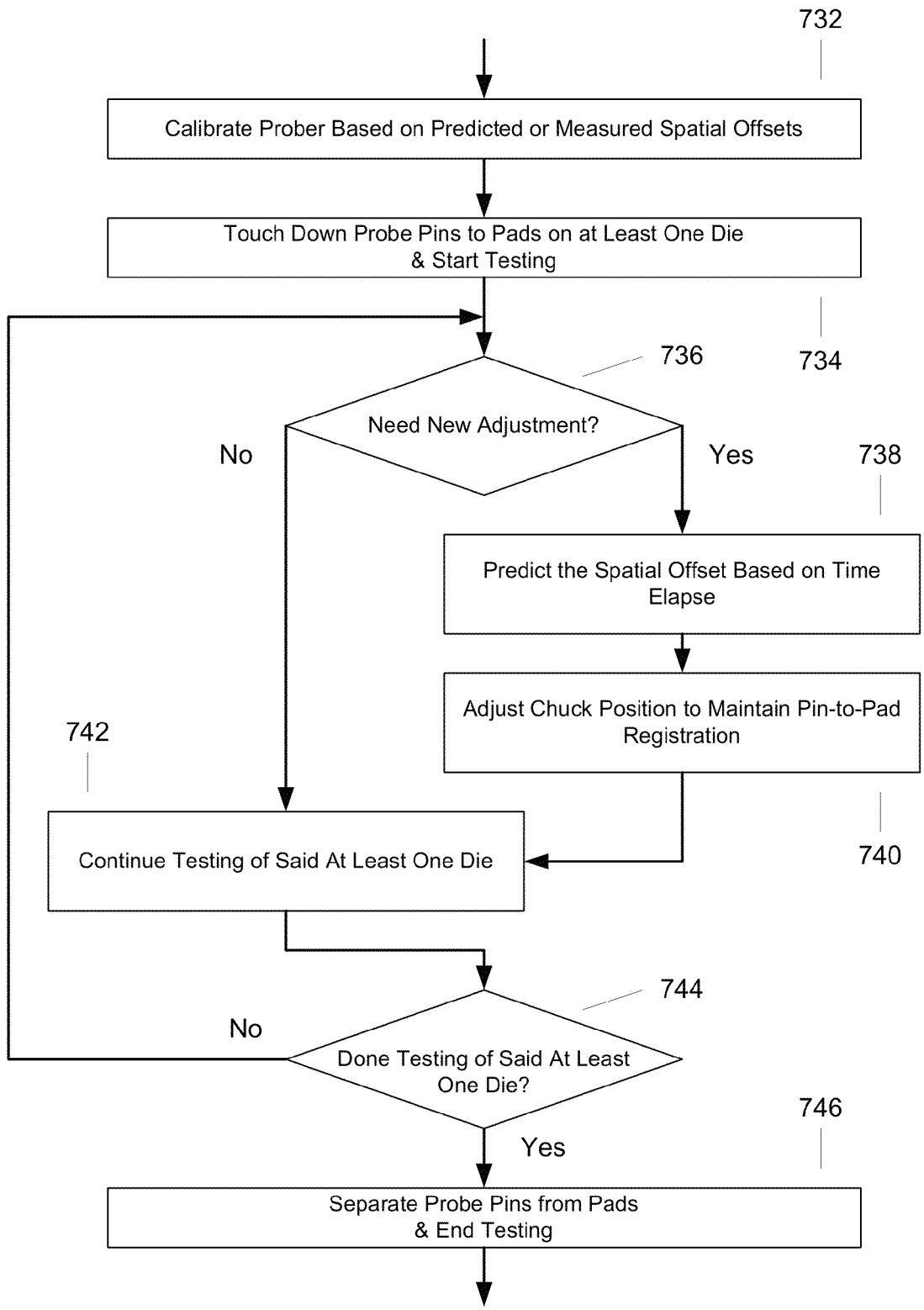
Figure 12C:
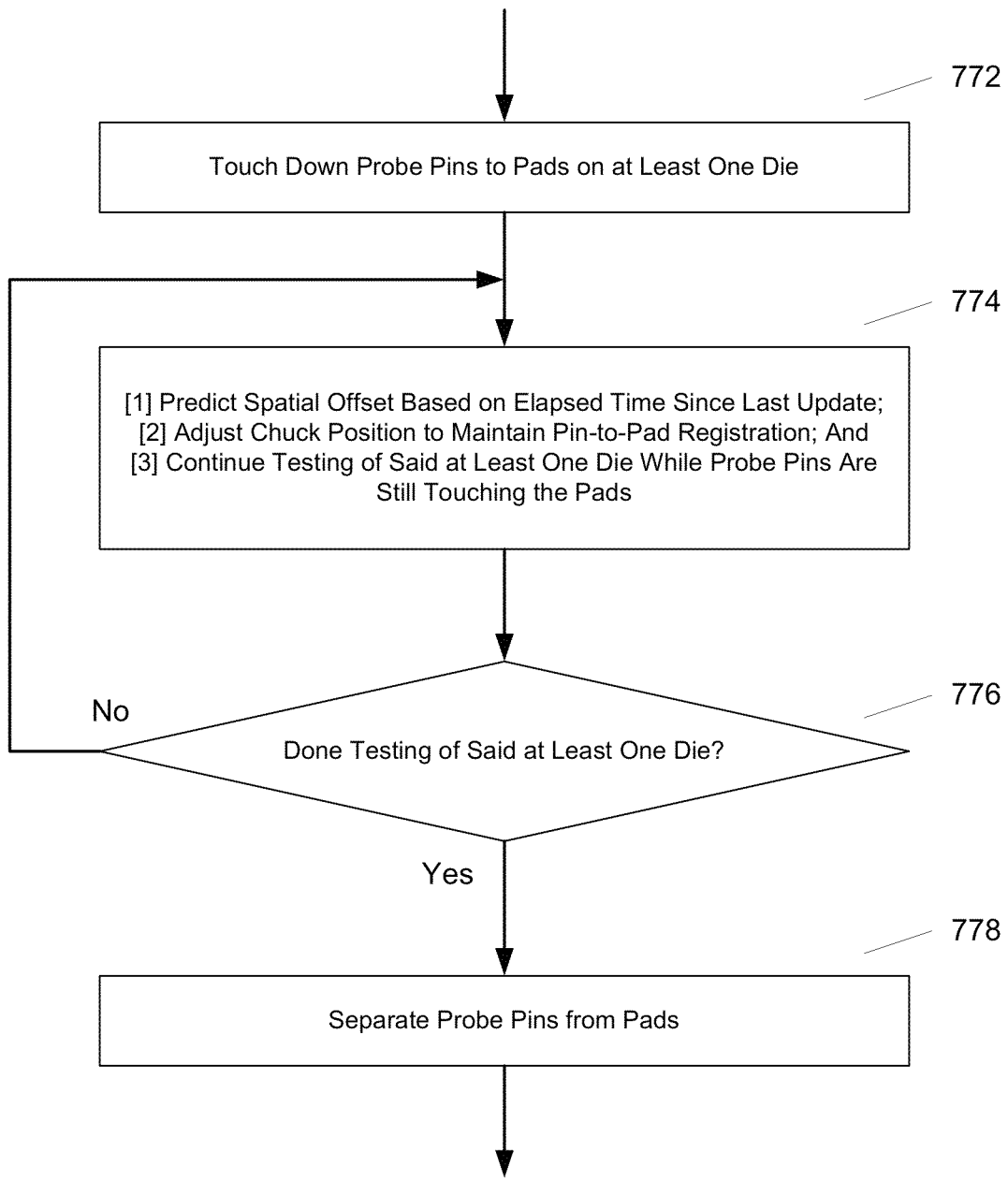

Turning now to FIG. 12, other exemplary probing processes are illustrated according to certain embodiments of the present invention. As compared to those shown in FIGS. 11A, 11B, and 11C, flow charts of FIGS. 12A, 12B, and 12C emphasize the fact that the wafer prober may be continuously adjusted during the testing of a particular die or set of dice in certain embodiments.

FIG. 12A is a high level flow chart and, as defined between blocks 702 and 724, it illustrates the probing and testing process after change in wafer chuck temperature, 704. The chart includes two distinct groups of operational elements involved in wafer probing. The upper group 706 includes "correction" tasks, corresponding to the operations of 476 in FIG. 8, whereas the tasks shown in the lower group 714 are for "prediction" using a model and for continuous probing/testing based the prediction. This group 714 corresponds to the operations of 474 in FIG. 8. In the correction group 706, three process blocks are included. First, spatial offsets are measured 708. Next, state variables are updated 710 based on the measurement and the previous predicted values, if any. The prober is then re-aligned based on the new measured data, at block 712. The prediction group 714 comprises three blocks, 716 through 720. These three process blocks form a loop. Branching conditions are omitted in the chart for the sake of simplicity. In block 716, new spatial offset values are predicted. These offset values may include, for example, the distance from a pad to a probe pin as shown in FIG. 6, and these values are used to probe a particular die or dice, at 718 and 720. The loop in the group 714 illustrates that these operations can be repeated as needed. Once the testing is done, as determined by decision block 722, this exemplary process terminates at 724.

FIG. 12B illustrates another aspect of the continuous probing and testing process in further detail according to teachings of the present invention. This exemplary flow chart shows relevant operations of probing process, during which at least one probe pin and at least one pad of a die are in contact with each other. The process starts at block 732, where a new calibration and alignment is done. Then the flow chart describes relevant operations during the testing of a die or dice between 734 and 746. The process includes two branches. If a new adjustment is needed, as indicated by the Yes branch at 736, additional actions are taken, 738 and 740, to reflect this requirement. Otherwise, the testing continues as explicitly indicated by block 742. For the decision block 736, similar criteria to those of 660 in the process of FIG. 11B may be used. These operations can be repeated as necessary, as shown by the loop following the No branch at the decision block 744. Once the testing of the selected die or dice is done, the probe card and the wafer are separated, at 746, and the exemplary testing process terminates.

FIG. 12C illustrates another exemplary process similar to those shown in FIGS. 12A and 12B. This flow chart emphasizes the fact that probing and, in particular, moving of probe card assembly relative to the wafer platform, can occur continuously and simultaneously during testing of a same die or dice. In other words, while the probe pins on the probe card are touched down on the test or bond pads of a die and testing of the die is being performed, movement (e.g. only in z direction) can occur, and this movement can be based on predictions from the thermal models described herein (e.g. the method of FIG. 11C). The beginning and ending blocks 772 and 778 in this figure correspond to blocks 734 and 746 of FIG. 12B, respectively. Block 774 describes these probing and testing operations that could occur simultaneously. As described in the block, the position of probe pins relative to the pads of a wafer can be adjusted while they are in contact with each other. In some embodiments, only the relative displacement along the z-direction is adjusted to avoid any catastrophic results due to inhomogeneous expansion or contraction of various parts of a wafer prober. In other embodiments, the probe card assembly and the wafer assembly may be moved relative to each other in all three directions. It should be noted, however, that, due to the elasticity of the various components such as probe card tips, the "moving" or "adjustment" may not involve actual change of (relative) positions of these components in the physical space. As in the exemplary processes illustrated in FIGS. 12A and 12B, this process can be repeated, based on the decision at 776, until the testing is completed for the selected die or dice.

Many of the methods of the present invention may be performed with digital processing systems, such as conventional general-purpose computers. Special purpose computer systems having dedicated processing and/or peripheral devices, which are specially programmed on hardware-level and/or software-level, may also be used.

Figure 13:
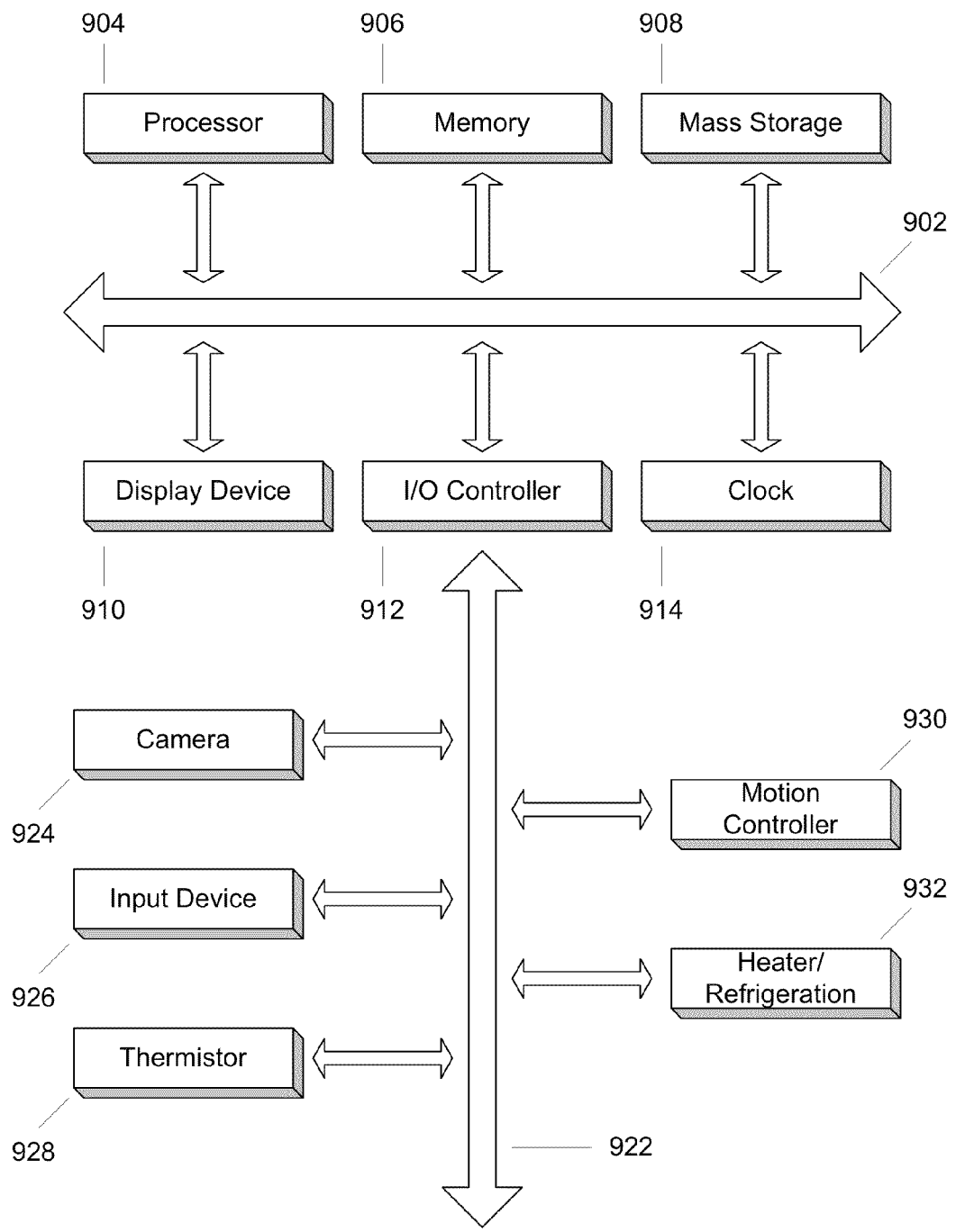
FIG. 13 illustrates a block diagram of an exemplary data processing system according to an embodiment of the present invention.

With reference to FIG. 13, the present invention embodied as a data processing system is shown as a block diagram. The diagram includes various main components connected to the main bus 902 and other peripheral devices connected to an auxiliary bus 922 coupled with an I/O controller 912. The main components include the main processor 904, memory 906, mass storage unit 908, and a display device 910. A clock 914 is also coupled to the main bus 902 in this exemplary embodiment. Other peripheral devices used in various embodiments of the present invention include, but not limited to, one or more DPS cameras 924, various input devices such as keyboards 926, and a motor system 930. Heaters, or refrigeration, 932 and thermistors 928 can also be connected to the system for automatic control of various functions of the prober system. Note that while FIG. 13 illustrates various components of a data processing system relevant to some embodiments of the present invention, it is not intended to represent any particular architecture or manner of interconnecting the components as such details are not germane to the present invention. It will also be appreciated that data processing systems with fewer or more components than shown in the figure may also be used with the present invention.

Thus, methods and apparatuses for automatically aligning a probe card to test or bond pads of an IC device, in a prober, have been provided. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A method for probing a die having a plurality of electrical contacts, the method comprising:
moving at least one of a substrate holding unit, which comprises a die, or a probe card assembly relative to each other to bring probe pins on the probe card assembly into electrical contact with the plurality of electrical contacts on the die;
testing the die;
moving at least one of the substrate holding unit or the probe card assembly in at least one of x direction or y direction while testing the die, wherein testing the die comprises maintaining the probe pins in proper electrical contact with the plurality of electrical contacts on the die, and wherein the moving in at least one of x direction or y direction is relative to the substrate holding unit and the probe card assembly; and
predicting a relative position of at least one of the probe pins with respect to a position of at least one of the electrical contacts as a function of time after a substantial change in a condition and wherein the moving is based on the predicting, and wherein the prediction is at least one of substantially in the x direction or substantially in the y direction.

2. A method as in claim 1, wherein:
said change in condition comprises a change in temperature.

3. A method as in claim 1, wherein:
said change in condition comprises a change based on a dynamic model, wherein the dynamic model comprises at least one fittable parameter.

4. A method as in claim 3 wherein:
performing at least one measurement of at least one of the probe pins with respect to a position of at least one of the electrical contacts as a function of time at least once after the change in a condition; and
updating said at least one fittable parameter based on said at least one measurement.

5. A method as in claim 1, wherein:
said change in condition comprises a change based on a dynamic model, wherein the dynamic model comprises at least one of a linear filter, a non-linear filter, an optimal filter, or a non-optimal filter.

6. A non-transitory machine readable medium containing executable program instructions which, when executed by a data processing system, causes the data processing system to perform a method comprising:
moving at least one of a substrate holding unit, which comprises a die, or a probe card assembly relative to each other to bring probe pins on the probe card assembly into electrical contact with the plurality of electrical contacts on the die;
testing the die;
moving at least one of the substrate holding unit or the probe card assembly in at least one of x or y direction while testing the die, wherein testing the die comprises maintaining the probe pins in proper electrical contact with the plurality of electrical contacts on the die, and wherein the moving in at least one of x direction or y direction is relative to the substrate holding unit and the probe card assembly; and
predicting a relative position of at least one of the probe pins with respect to a position of at least one of the electrical contacts as a function of time after a substantial change in a condition and wherein the moving is based on the predicting, and wherein the prediction is at least one of substantially in the x direction or substantially in the y direction.

7. The non-transitory machine readable medium as in claim 6, wherein:
said change in condition comprises a change in temperature.

8. The non-transitory machine readable medium as in claim 6, wherein:
said change in condition comprises a change based on a dynamic model, wherein the dynamic model comprises at least one fittable parameter.

9. The non-transitory machine readable medium as in claim 8 wherein:
performing at least one measurement of at least one of the probe pins with respect to a position of at least one of the electrical contacts as a function of time at least once after the change in a condition; and
updating said at least one fittable parameter based on said at least one measurement.

10. The non-transitory machine readable medium as in claim 6, wherein:
said change in condition comprises a change based on a dynamic model, wherein the dynamic model comprises at least one of a linear filter, a non-linear filter, an optimal filter, or a non-optimal filter.

11. A prober comprising:
a frame;
a substrate holding unit configured to hold a substrate which comprises a die, wherein the die having a plurality of electrical contacts, and the substrate holding unit coupled to the frame;
a probe card assembly having a plurality of contact electrodes, the probe card assembly coupled to the frame;
a motor assembly coupled to the frame and to at least one of the substrate holding unit or the probe card assembly;
a processing system coupled to the motor assembly, the processing system configured to cause testing of the die by bringing the plurality of contact electrodes into electrical contact with electrical contacts on the die and configured to cause movement, through the motor assembly, of at least one of the substrate holding unit or the probe card assembly while testing of the die, wherein said movement is at least in one of x or y direction, wherein testing the die comprises maintaining the probe pins in proper electrical contact with the plurality of electrical contacts on the die, and wherein the moving in at least one of x direction or y direction is relative to the substrate holding unit and the probe card assembly; and
a configuration to make a prediction of a relative position of at least one of the contact electrodes with respect to a position of at least one of the electrical contacts on the die as a function of time after a substantial change in a condition during probing of the die and wherein the movement is based on the predicting, and wherein the prediction is at least one of substantially in the x direction or substantially in the y direction.

12. A prober as in claim 11, wherein:
said change in condition comprises a change in temperature.

13. A prober as in claim 11, wherein:
said change in condition comprises a change based on a dynamic model, wherein the dynamic model comprises at least one fittable parameter.

14. A prober as in claim 13 wherein the processing system further comprises a configuration to:

perform at least one measurement of at least one of the contact electrodes with respect to a position of at least one of the electrical contacts on the die as a function of time at least once after the change in a condition; and
update said at least one fittable parameter based on said at least one measurement.

15. A prober as in claim 11, wherein:
said change in condition comprises a change based on a dynamic model, wherein the dynamic model comprises at least one of a linear filter, a non-linear filter, an optimal filter, or a non-optimal filter.

16. A method for probing a die having a plurality of electrical contacts, the method comprising:
moving at least one of a substrate holding unit, which comprises a die, or a probe card assembly relative to each other to bring probe pins on the probe card assembly into electrical contact with the plurality of electrical contacts on the die;
testing the die;
moving at least one of the substrate holding unit or the probe card assembly in at least one of x or y direction while testing the die;
predicting a relative position of at least one of the probe pins with respect to a position of at least one of the electrical contacts as a function of time after a substantial change in a condition and wherein the moving is based on the predicting, and wherein the predicting is at least one of substantially in the x direction or substantially the y direction.

17. A method as in claim 16, wherein:
said change in condition comprises a change in temperature.

18. A method as in claim 16, wherein:
said change in condition comprises a change based on a dynamic model, wherein the dynamic model comprises at least one fittable parameter.

19. A method as in claim 18, wherein:
performing at least one measurement of at least one of the probe pins with respect to a position of at least one of the electrical contacts as a function of time at least once after the change in a condition; and
updating said at least one fittable parameter based on said at least one measurement.

20. A method as in claim 16, wherein:
said change in condition comprises a change based on a dynamic model, wherein the dynamic model comprises at least one of a linear filter, a non-linear filter, an optimal filter, or a non-optimal filter.

21. A non-transitory machine readable medium containing executable program instructions which, when executed by a data processing system, causes the data processing system to perform a method comprising:
moving at least one of a substrate holding unit, which comprises a die, or a probe card assembly relative to each other to bring probe pins on the probe card assembly into electrical contact with the plurality of electrical contacts on the die;
testing the die;
moving at least one of the substrate holding unit or the probe card assembly in at least one of x or y direction while testing the die;
predicting a relative position of at least one of the probe pins with respect to a position of at least one of the electrical contacts as a function of time after a substantial change in a condition and wherein the moving is based on the predicting, and wherein the predicting is at least one of substantially in the x direction or substantially the y direction.

22. The non-transitory machine readable medium as in claim 21, wherein:
said change in condition comprises a change in temperature.

23. The non-transitory machine readable medium as in claim 21, wherein:
said change in condition comprises a change based on a dynamic model, wherein the dynamic model comprises at least one fittable parameter.

24. The non-transitory machine readable medium as in claim 23, wherein:
performing at least one measurement of at least one of the probe pins with respect to a position of at least one of the electrical contacts as a function of time at least once after the change in a condition; and
updating said at least one fittable parameter based on said at least one measurement.

25. The non-transitory machine readable medium as in claim 21, wherein:
said change in condition comprises a change based on a dynamic model, wherein the dynamic model comprises at least one of a linear filter, a non-linear filter, an optimal filter, or a non-optimal filter.

26. A prober comprising:
a frame;
a substrate holding unit configured to hold a substrate which comprises a die, wherein the die has a plurality of electrical contacts, and the substrate holding unit coupled to the frame;
a probe card assembly having a plurality of contact electrodes, the probe card assembly coupled to the frame;
a motor assembly coupled to the frame and to at least one of the substrate holding unit or the probe card assembly;
a processing system coupled to the motor assembly, the processing system configured to cause testing of the die by bringing the plurality of contact electrodes into electrical contact with electrical contacts on the die and configured to cause movement, through the motor assembly, of at least one of the substrate holding unit or the probe card assembly while testing of the die, wherein said movement is at least in one of x or y direction, wherein the processing system further comprises:
a configuration to make a prediction of a relative position of at least one of the contact electrodes with respect to a position of at least one of the electrical contacts on the die as a function of time after a substantial change in a condition during probing of the die and wherein the movement is based on the prediction, and wherein the prediction is at least one of substantially in the x direction or substantially the y direction.

27. A prober as in claim 26, wherein:
said change in condition comprises a change in temperature.

28. A prober as in claim 26, wherein:
said change in condition comprises a change based on a dynamic model, wherein the dynamic model comprises at least one fittable parameter.

29. A prober as in claim 28, wherein the processing system further comprises a configuration to:
perform at least one measurement of at least one of the contact electrodes with respect to a position of at least one of the electrical contacts on the die as a function of time at least once after the change in a condition; and update said at least one fittable parameter based on said at least one measurement.

30. A prober as in claim 26, wherein:

said change in condition comprises a change based on a dynamic model, wherein the dynamic model comprises at least one of a linear filter, a non-linear filter, an optimal filter, or a non-optimal filter.

\* \* \* \* \*